United States Patent
Cho et al.

(10) Patent No.: US 6,813,214 B2
(45) Date of Patent: Nov. 2, 2004

(54) NON-VOLATILE SEMICONDUCTOR MEMORY DEVICE

(75) Inventors: Tae-Hee Cho, Kyunggi-do (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/693,415

(22) Filed: Oct. 24, 2003

(65) Prior Publication Data

US 2004/0085831 A1 May 6, 2004

Related U.S. Application Data

(62) Division of application No. 09/997,533, filed on Nov. 29, 2001, now Pat. No. 6,704,239.

(30) Foreign Application Priority Data

Jul. 13, 2001 (KR) .......................................... 2001-42319

(51) Int. Cl.[7] .............................................. G11C 8/00
(52) U.S. Cl. ............................ 365/230.04; 365/230.08; 365/185.12; 365/185.17
(58) Field of Search ....................... 365/230.08, 185.12, 365/185.17

(56) References Cited

U.S. PATENT DOCUMENTS

| | | | |
|---|---|---|---|
| 5,473,563 A | | 12/1995 | Suh et al. |
| 5,696,717 A | | 12/1997 | Koh |
| 5,768,188 A | | 6/1998 | Park et al. |
| 5,768,215 A | * | 6/1998 | Kwon et al. ............. 365/238.5 |
| 6,049,949 A | * | 4/2000 | Guthke ..................... 24/16 PB |
| 6,278,636 B1 | | 8/2001 | Lee |
| 6,408,419 B1 | * | 6/2002 | Karabed et al. ............ 714/792 |

* cited by examiner

Primary Examiner—Vu A. Le
(74) Attorney, Agent, or Firm—Marger Johnson & McCollom, P.C.

(57) ABSTRACT

A non-volatile semiconductor memory device includes a plurality of page buffers, each corresponding to a sense node. Voltages of a first set of sense nodes are varied according to states of corresponding memory cells during a first sense period, while voltages of a second set of sense nodes are fixed at a predetermined voltage. During the second sense period, voltages of the second set of sense nodes are varied according to states of corresponding memory cells, while voltages of the first set of sense nodes are fixed at a predetermined voltage. Using this sensing scheme, even though a sense node corresponding to an OFF cell is floated, a voltage of the floated sense node is not coupled down when a voltage of a neighboring sense node corresponding to an ON cell is lowered.

18 Claims, 14 Drawing Sheets

(Vcc>Vpre>Vsen)

NON-VOLATILE SEMICONDUCTOR MEMORY DEVICE

This application is a divisional of U.S. patent application Ser. No. 09/997,533 now U.S. Pat. No. 6,704,239, filed on Nov. 29, 2001, which is herein incorporated by reference in its entirety.

FIELD OF THE INVENTION

The present invention relates generally to non-volatile semiconductor memory devices and, more specifically, to a method of sensing data stored in a memory cell of a flash memory device.

BACKGROUND OF THE INVENTION

A semiconductor memory device can be roughly classified as either a volatile semiconductor memory device or a non-volatile semiconductor memory device. Volatile semiconductor memory devices can be classified as dynamic random access memory (DRAM) devices or static random access memory (SRAM) devices. Volatile semiconductor memory devices have rapid read/write speeds but, unfortunately, the contents stored therein disappear when external power is cut off.

Non-volatile semiconductor memory devices can be classified as mask read-only memory (MROM) devices, programmable read-only memory (PROM) devices, erasable programmable read-only memory (EPROM) devices, or electrically erasable programmable read-only memory (EEPROM) devices. Non-volatile semiconductor memory devices hold their contents even when external power supply thereto is interrupted. Non-volatile semiconductor memory devices are therefore used to store contents that must be maintained even in the event of power loss.

In MROM, PROM, and EPROM devices, however, it is inconvenient to erase and write data, and general users therefore have difficulty updating the stored contents therein. Data stored in EEPROM devices, on the other hand, can be electrically programmed and erased quickly, and the use of these devices has therefore become popular in auxiliary memory and system programming devices that require continuous updating of contents. Furthermore, large-volume auxiliary memory devices typically use flash EEPROM devices because they have a higher integration density than conventional EEPROM devices. Among the various types of flash EEPROM devices, the integration density of NAND-type devices is generally higher than NOR- and AND-type devices.

A flash EEPROM device includes memory cells, each of which includes a floating gate transistor having a source, a drain, a floating gate, and a control gate. A memory cell in a NAND-type flash EEPROM device is electrically erased and programmed using Fowler-Nordheim (F-N) tunneling current. Various methods for erasing and programming NAND-type flash EEPROM devices are disclosed in U.S. Pat. No. 5,473,563, entitled "Nonvolatile Semiconductor Memory", and in U.S. Pat. No. 5,696,717, entitled "Nonvolatile Integrated Circuit Memory Devices Having Adjustable Erase/Program Threshold Voltage Verification Capability", the disclosures of which are incorporated herein by reference.

In general, an erased memory cell (ON cell) stores data of a logic "1". When a read voltage of 0V is applied to a word line coupled with the erased memory cell, current flows through the ON cell. A programmed memory cell (OFF cell) stores data of a logic "0". When a read voltage of 0V is applied to a word line coupled with the programmed memory cell, no current flows through the OFF cell.

FIG. 1 is a schematic circuit diagram of a conventional non-volatile semiconductor memory device, according to the prior art. As illustrated in FIG. 1, bit lines BL1 to BL4 are arranged in communication with a memory cell array 10. For clarity of description, only four bit lines BL1 to BL4, and their related page buffers, are illustrated in FIG. 1. The bit lines BL1 to BL4 are arranged in pairs BL1 and BL2, BL3 and BL4 with each bit line pair connected to a corresponding sense node SO1, SO2 through a respective bit line bias and select section 12_O, 12_E of the page buffer. A corresponding precharge section and a sense and latch section 14_O, 14_E is also connected to a respective one of the sense nodes SO1, SO2.

More specifically, an odd bit line bias and select section 12_O selects a bit line of the first bit line pair BL1 and BL2. An even bit line bias and select section 12_E selects a bit line of the second bit line pair BL3 and BL4. Each of the bit line bias and select sections 12_O and 12_E includes four NMOS transistors M1 to M4, connected as illustrated. Selected bit lines are connected with corresponding sense nodes SO1 and SO2, and unselected bit lines are fixed at a predetermined voltage (e.g., 0V). The precharge section of each page buffer includes a PMOS transistor M6. Each of the sense and latch sections 14_O, 14_E includes three NMOS transistors M5, M7, M8 and a latch formed from two inverters INV1, INV2.

FIG. 2 is a timing diagram illustrating an operation of one of the page buffers of the conventional memory device of FIG. 1. Referring to FIGS. 1 and 2, odd-numbered bit lines BL1, BL3 and even-numbered bit lines BL2, BL4 are selected by different page addresses, and a read operation is carried out in a page unit. When memory cells connected to bit lines of an even-numbered page address are accessed, memory cells connected to bit lines of an odd-numbered page address are shielded (and vice-versa).

Shielding unselected bit lines is done to prevent parasitic coupling capacitance between adjacent bit lines, which increases as a bit line pitch is reduced. If bit lines adjacent to selected bit lines are not shielded, then when a bit line connected to an ON cell is discharged, a voltage on a bit line connected to an OFF cell that is being floated may be coupled down together with the ON cell. When this happens, the OFF cell may be improperly recognized as an ON cell, thereby resulting in a read error.

Assuming, for example, that the even-numbered bit lines BL2, BL4 are selected based on an even-numbered page address, the odd-numbered bit lines BL1, BL3 are shielded by applying a ground voltage (0V) through the NMOS transistors M1. In this case, during a precharge period, a power supply voltage Vcc is supplied to the sense nodes SO1, SO2 through the PMOS transistors M6. The PMOS transistors M6 each have a gate that receives a precharge control signal nSOSHLD. At this time, the selected bit lines BL2, BL4 are precharged with a precharge voltage Vpre through the fourth NMOS transistors M4, which are controlled by an even bias control signal BLBIAS_E. Unselected bit lines BL1, BL3 are floated because the third NMOS transistors M3 are turned off by an odd bias control signal BLBIAS_O.

After the selected bit lines BL2, BL4 are charged up to the precharge voltage Vpre, a voltage on the even bias control signal BLBIAS_E is changed from the precharge voltage Vpre to a ground voltage GND, so that the fourth NMOS transistor M4 of each bias and select section is turned off.

The even bit lines BL2, BL4 are then floated, while the sense nodes SO1, SO2 are maintained at a high voltage level Vcc. When the selected bit lines BL2, BL4 are floated, voltages of those bit lines BL2, BL4 vary depending on states of corresponding cell transistors.

For example, assuming that an ON cell is connected to the second bit line BL2 and an OFF cell is connected to the fourth bit line BL4, the second bit line BL2 voltage is gradually reduced as cell current flows through the ON cell. The fourth bit line BL4 voltage, however, is maintained at the precharge voltage Vpre because the corresponding OFF cell prevents current flow. During this "bit line develop period," since the precharge control signal nSOSHLD is at a low level, each PMOS transistor M6 becomes active, and each sense node SO1, SO2 is thereby maintained at a high voltage level Vcc.

After voltages of the selected bit lines BL2, BL4 have been developed, the even bias control signal BLBIAS_E has a sense voltage level Vsen that is lower than the precharge voltage level Vpre. This causes the fourth NMOS transistor M4, coupled with the second bit line (corresponding to an ON cell), to be turned on. The fifth NMOS transistor M5, coupled with the fourth bit line (corresponding to an OFF cell), is turned off.

Before a voltage of the even bias control signal BLBIAS_E is increased up to the sense voltage Vsen, the precharge control signal nSOSHLD transitions from low to high, thereby floating the sense nodes SO1, SO2. As a result, a voltage on the first sense node SO1 is rapidly lowered toward a bit line level through a discharge path that consists of the fourth NMOS transistor M4 of the odd bit line bias and select section 12_O, the second bit line BL2, and the ON cell transistor. On the other hand, since the fourth NMOS transistor M4 of the even bit line bias and select section 12_E, coupled with the bit line BL4, is turned off, the second sense node SO2 is maintained at a high voltage level Vcc.

A threshold voltage of a sixth NMOS transistor M7 is higher than the precharge voltage Vpre. For this reason, the sixth NMOS transistor M7, having a gate connected to the first sense node SO1, is turned off, while the sixth NMOS transistor M7, having a gate connected to the second sense node SO2, is turned on. When a latch signal φLATCH is activated to its high level, a value Q1 of a latch (including two inverters INV1, INV2) of the sense and latch section 14_O is maintained at an initial value (e.g., "0"). A value Q2 of a latch (including two inverters INV1, INV2) of the sense and latch section 14_E becomes high (e.g., "1"). This period is called "a sense period."

A read operation of the non-volatile semiconductor memory device according to the prior art has several disadvantages. Among other things, a sense node (e.g. SO2) corresponding to an OFF cell is floated during the sense period, because its corresponding fourth NMOS transistor M4 and PMOS transistor M6 are all turned off. Accordingly, when a voltage of an adjacent sense node (e.g. SO1), corresponding to an ON cell, falls toward a bit line level, a voltage of the adjacent floated sense node is affected by parasitic coupling capacitance Cc between the sense nodes. Referring to FIG. 3A, if the parasitic coupling capacitance Cc is small, the effect of that capacitance Cc on the floated sense node SO2 may be insufficient to lower the voltage of the floated sense node SO2 below a high voltage Vcc level.

However, as a design rule is reduced, integration density is increased and the distance between bit lines is reduced. Parasitic coupling capacitance Cc is therefore inevitably increased. Referring to FIG. 3B, a voltage of the floated sense node SO2 may therefore be coupled down based on voltage variations of the adjacent sense node SO1. The greater the influence by an adjacent sense node SO1 on a floated sense node SO2, the more the voltage of the floated sense node SO2 will be lowered. If the floated sense node voltage is lowered below a trip voltage Vtrip for changing a latch value of a page buffer, a read error occurs.

As illustrated in FIG. 3B, for example, a latch value Q2 has an erroneous data value of "0" rather than the expected value of "1" because of the coupling down of the floated sense node SO2 due to parasitic capacitance with the adjacent sense node SO1. Therefore, although an integration density increases, a read scheme is required to prevent the voltage of a floated sense node from being affected by neighboring sense nodes.

SUMMARY OF THE INVENTION

An object of this invention is to enable a non-volatile semiconductor memory device capable of reducing read errors that result from capacitive coupling between adjacent sense nodes.

Another object of the present invention is to provide a read method capable of reducing read errors caused by capacitive coupling between adjacent sense nodes.

Still another object of the present invention is to provide a non-volatile semiconductor memory device having a sensing structure suitable for high-density integration.

According to a first aspect of the present invention, a method of sensing data stored in an array of memory cells arranged at intersections of rows and columns is provided. According to this method, a precharge voltage is supplied to the columns. The precharge voltage is then cut off to develop voltages of the columns. A sense voltage is supplied to first columns to sense voltages on first sense nodes during a first sensing period. Also during the first sensing period, second sense nodes, corresponding to second columns, are supplied with a predetermined bias voltage.

In accordance with another aspect of the present invention, a memory device includes an array of memory cells arranged in rows and columns. A page buffer circuit has page buffers corresponding to the columns. Each of the page buffers includes a bias transistor connected between a corresponding column and a sense node, a current supplying transistor connected between a power supply voltage and the sense node, and a latch connected to the sense node. A method of reading data from this memory device begins by supplying a precharge voltage to the columns and then cutting off the precharge voltage to develop voltages of the columns. A sense voltage is then supplied to first columns to sense voltages on first sense nodes corresponding to the first columns during a first sensing period. During the first sensing period, the first sense nodes are connected to or floated from the even-numbered columns based on a state of the respective memory cells. The second sense nodes, corresponding to second columns, are supplied with a predetermined bias voltage.

In accordance with still other aspect of the present invention, a non-volatile memory device includes an array of memory cells arranged in rows and columns. A plurality of page buffers are connected to the columns. Each of the page buffers comprises a bias transistor connected between a corresponding column and a corresponding sense node, a latch connected to the corresponding sense node, and a precharge transistor connected between a power supply voltage and the corresponding sense node. A control logic controls the page buffers during a read mode of operation. In this embodiment, the control logic controls the bias and precharge transistors of the respective page buffers so that second sense nodes are fixed at a predetermined bias voltage during a first sensing period while voltages on first sense nodes are sensed. The control logic controls the bias and precharge transistors of the respective page buffers so that the first sense nodes are fixed at the predetermined bias voltage during a second sensing period when voltages on the second sense nodes are sensed.

BRIEF DESCRIPTION OF THE DRAWINGS

A greater understanding and appreciation of the present invention, and its attendant advantages, will be obtained through the following detailed description of preferred embodiments thereof, made in conjunction with the accompanying drawings in which like reference symbols indicate like elements, wherein.

DETAILED DESCRIPTION OF PREFERRED EMBODIMENTS

According to one aspect of the invention, voltages of a first set of sense nodes in a non-volatile semiconductor memory device are varied during a first sense period based on states of corresponding memory cells. At the same time, voltages of a second set of sense nodes are fixed at a predetermined voltage. During a second sense period, voltages of the first set of sense nodes are varied according to states of corresponding memory cells while voltages of the second set of sense nodes are fixed. Using this sense control scheme, a voltage of a floated sense node, corresponding to an OFF, is not coupled down when a voltage of a neighboring sense node, corresponding to an ON cell, is lowered.

Various aspects and embodiments of the invention will be described below wherein a NAND-type flash memory device is used to provide the non-volatile semiconductor memory device. It should be noted, however, that other types of non-volatile memory devices could also be used. In addition, it should be noted that during the first sense period, the first set of sense nodes can be either even- or odd-numbered sense nodes with the second set of sense nodes being the opposite, odd- or even-numbered sense nodes, respectively.

Figure 1:
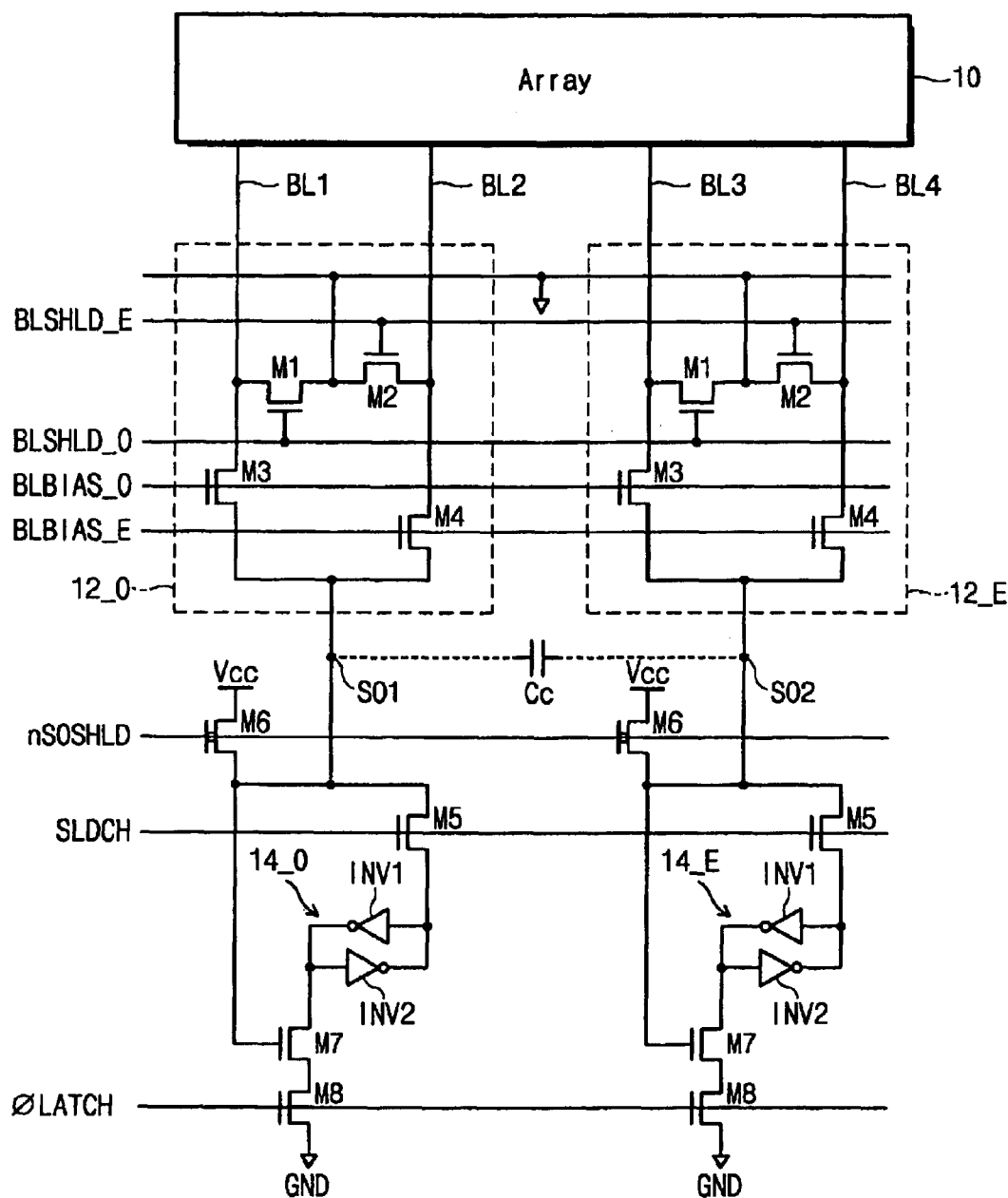
FIG. 1 is a schematic circuit and block diagram showing a non-volatile semiconductor memory device having a page buffer circuit according to the prior art.
Figure 2:
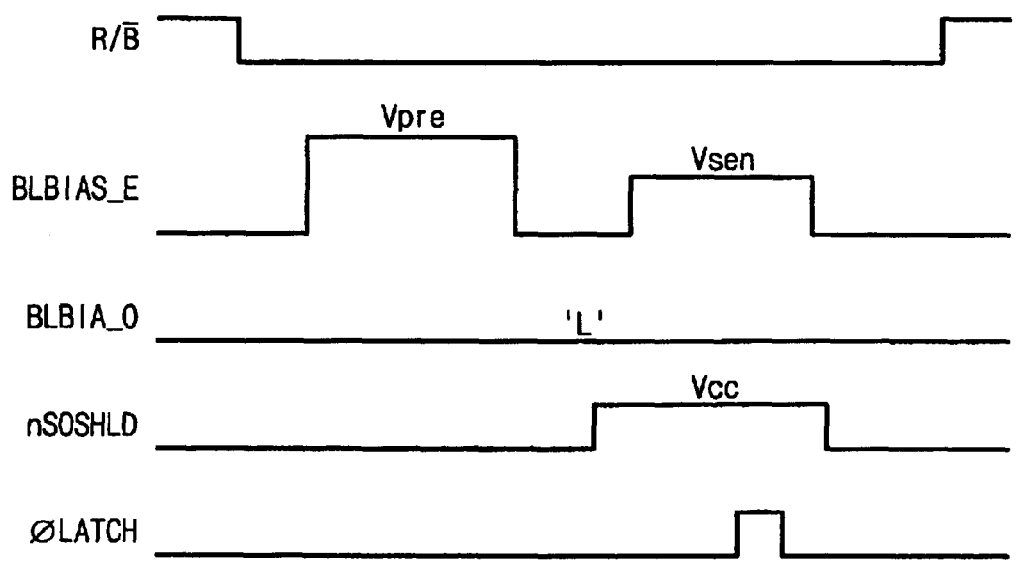
FIG. 2 is a timing diagram illustrating control signals for use in a page buffer of the memory device of FIG. 1.
Figure 3A:
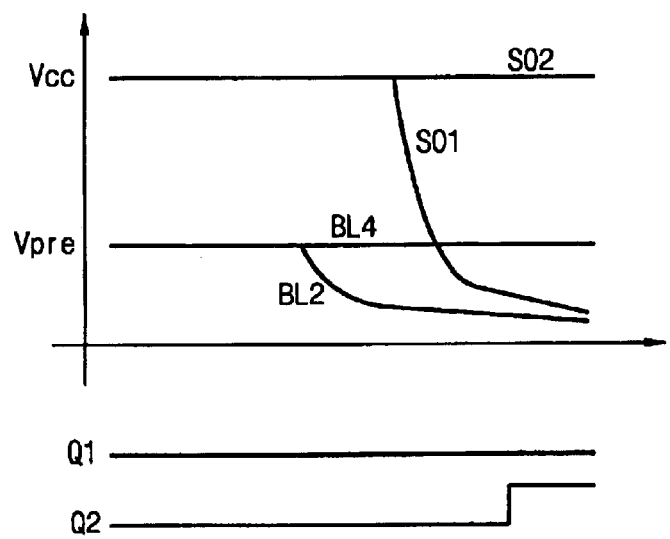
FIGS. 3A and 3B are graphs illustrating voltage variations of sense nodes and bit lines of the memory device of FIG. 1 during a normal read operation and an erroneous read operation, respectively.
Figure 3B:
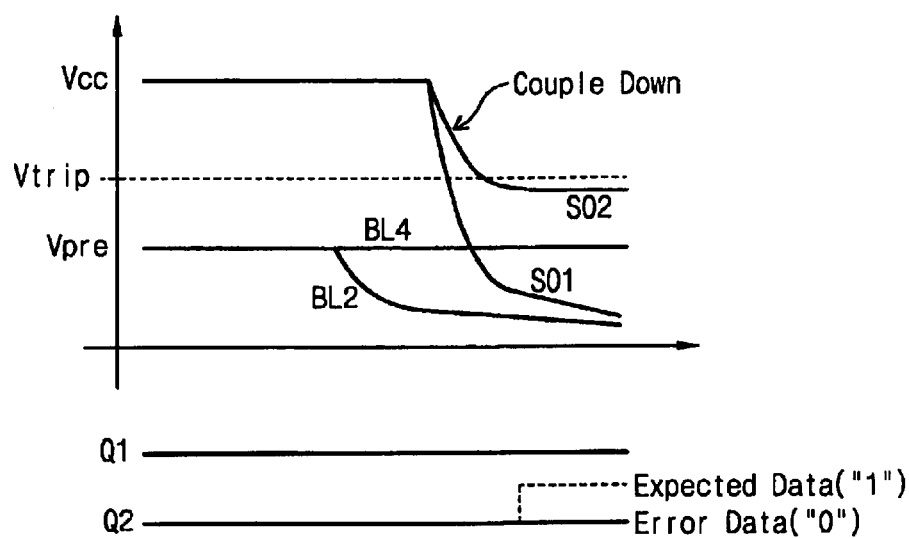
Figure 4:
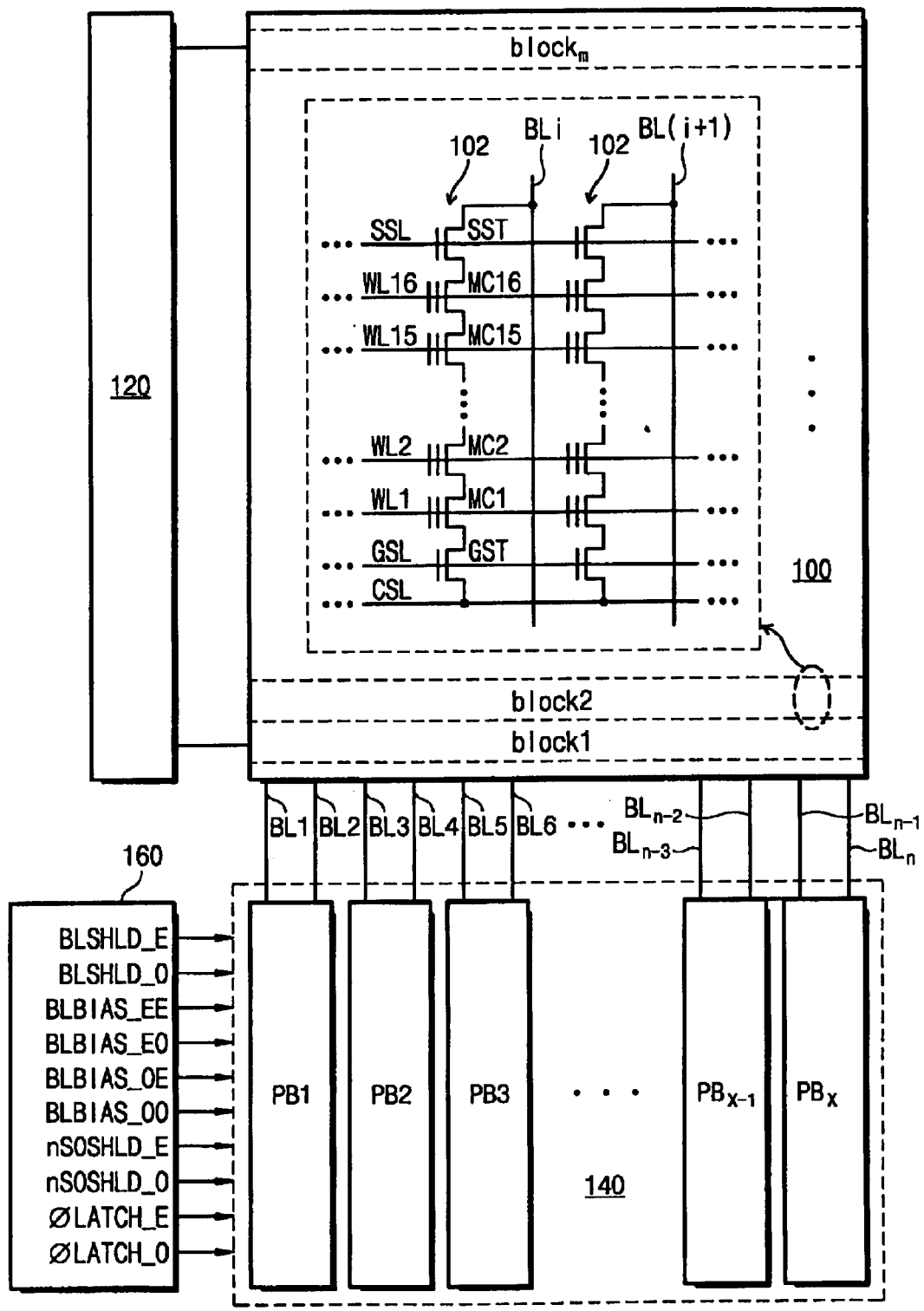
FIG. 4 is a schematic circuit and block diagram showing a non-volatile semiconductor memory device according to a preferred embodiment of the present invention.

Various preferred aspects and embodiments of the present invention will now be more fully described with reference to the attached drawings. FIG. 4 is a schematic circuit and block diagram illustrating a non-volatile semiconductor memory device according to one embodiment of the present invention. Referring to FIG. 4, a non-volatile semiconductor memory device has a memory cell array 100, a row decoder circuit 120, a page buffer circuit 140, and a page buffer control logic 160. The memory cell array 100 includes a plurality of memory blocks, each of which has a plurality of strings 102. Each string 102 includes a first select transistor SST, referred to as a string select transistor, connected to a corresponding bit line and to a signal line SSL. A second select transistor GST, referred to as a ground select transistor, is connected to a ground signal line GSL and to a common source line CSL. A plurality of memory cells MC16 to MC1 are connected in series between the first and second select transistors SST and GST and have control gates connected to corresponding word lines WL16 to WL1, respectively.

Each memory cell includes a floating gate transistor that is erased and programmed using F-N tunneling current. The string select line SSL, the word lines WL16 to WL1, and the ground select line GSL are connected to the row decoder circuit 120. The row decoder circuit 120 selects one of the memory blocks and controls voltages of signal lines SSL, WL16 to WL1, and GSL of the selected block according to each mode of operation.

Continuing to refer to FIG. 4, bit lines BL1 to BLn, arranged in parallel over the memory blocks, are electrically connected to the page buffer circuit 140. The page buffer circuit 140 operates in response to control signals from the page buffer control logic 160. The construction and operation of the page buffer control logic 160 will be described in detail hereinafter. The bit lines BL1 to BLn are divided into bit line groups or bit line segments, each of which includes two bit lines.

The page buffer circuit 140 includes page buffers PB1 to PBx, each corresponding to one of the bit line groups. More particularly, a first (odd-numbered) bit line group BLG1, including first and second bit lines BL1, BL2 is connected to a first page buffer PB1. A second (even-numbered) bit line group, including third and fourth bit lines BL3, BL4 is connected to a second page buffer PB2. Each of the remaining bit line groups, including bit line pairs BL5 and BL6, BL7 and BL8, . . . , and BLn-1 and BLn are connected to the remaining page buffers in a similar manner.

Figure 5:
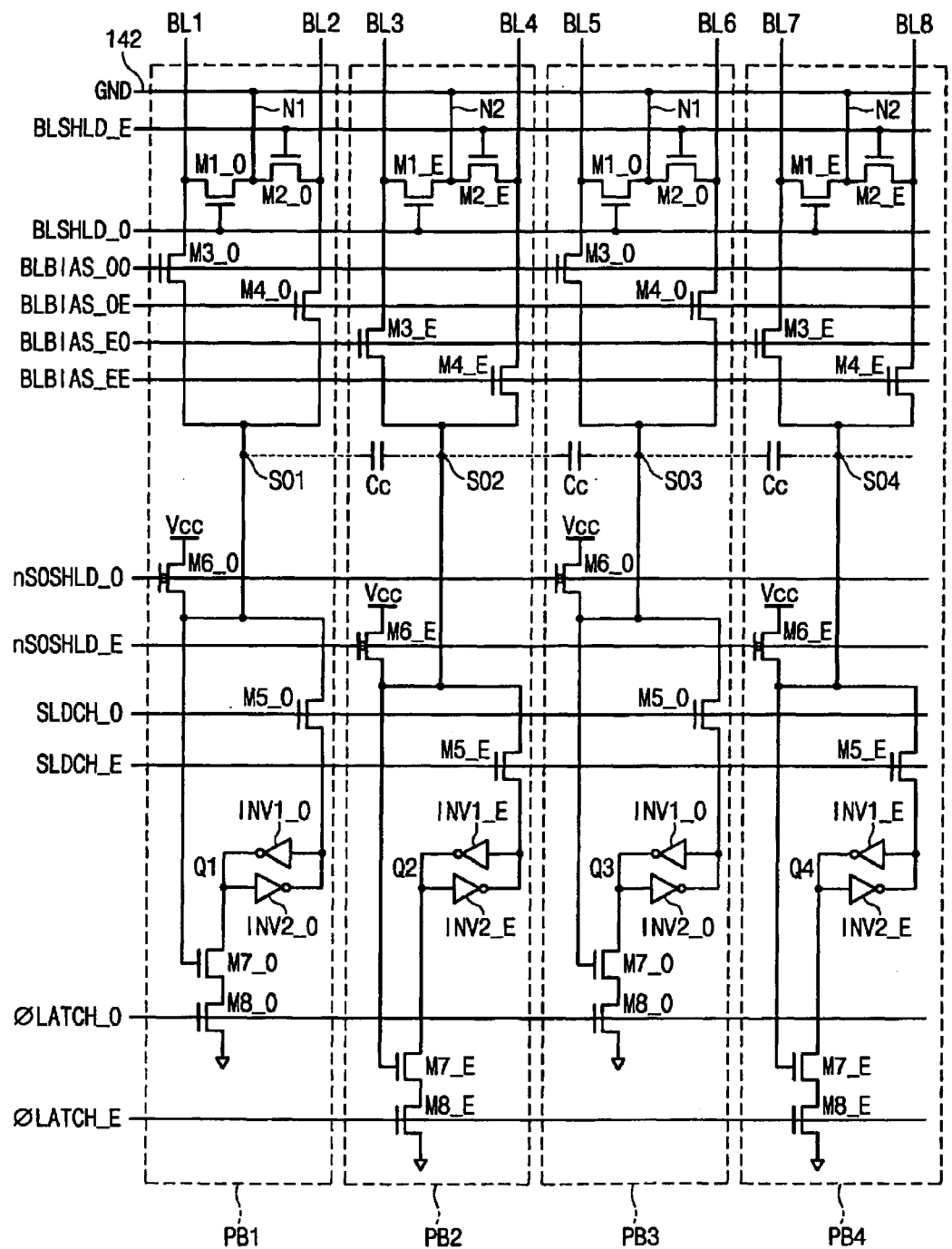
FIG. 5 is a schematic circuit diagram of a page buffer circuit of the memory device of FIG. 4 according to another aspect of the present invention.

FIG. 5 is a schematic circuit diagram showing a page buffer circuit according to another aspect of the present invention. Referring to FIG. 5, only the first through fourth page buffers PB1 to PB4 are shown for ease of explanation. Each of the page buffers PB1 to PB4 corresponds to a respective one of the first through fourth bit line groups BLG1 to BLG4. Each bit line group BLG1 to BLG4 includes a respective pair of the first through eighth bit lines BL1 to BL8. Those skilled in the art will understand that page buffers corresponding to remaining bit line groups are constructed in the same manner as the groups illustrated.

In the figures, the letter "E" indicates even-numbered items and the letter "O". indicates odd-numbered items. The components of odd-numbered page buffers PB1, PB3 are marked using the same reference numerals as each other. The components of even-numbered page buffers PB2, PB4 are likewise marked using the same reference numerals as each other. For convenience, only two page buffers, one odd PB1 and one even PB2, will be described.

Still referring to FIG. 5, an odd page buffer PB1 includes a bit line bias and select section, a precharge section, and a sense and latch section. The first, odd page buffer PB1 is connected to a first bit line group BLG1, including first and second bit lines BL1, BL2. The first page buffer PB1 is further connected to the first through seventh odd NMOS transistors M1_O, M2_, M3_O, M4_O, M5_O, M7_O, M8_O, an odd PMOS transistor M6_, and two odd inverters INV1_O, INV2_O.

The first and second odd NMOS transistors M1_, M2_O are serially connected between the first and second bit lines BL1, BL2 and are controlled by odd and even control signals BLSHLD_O, BLSHLD_E, respectively. A node N1, interconnecting the first and second odd transistors M1_O, M2_O, is coupled to a signal line 142. The odd and even control signals BLSHLD_O, BLSHLD_E are activated independently and exclusively. The signal line 142 has a ground voltage GND during a read operation mode.

The third odd NMOS transistor M3_O is connected between the first bit line BL1 and a first sense node SO1 and is turned on and off according to an odd-odd bias control signal BLBIAS_OO. The fourth odd NMOS transistor M4_O is connected between the second bit line BL2 and the first sense node SO1 and is turned on and off according to an odd-even bias control signal BLBIAS_OE.

The bit line bias and select section of first the page buffer PB1 includes the first to fourth odd NMOS transistors M1_O to M4_O. The PMOS transistor M6_O is connected between a power supply voltage Vcc and the first sense node SO1 and is controlled by an odd precharge control signal nSOSHLD_O. The odd PMOS transistor M6_O is part of the precharge section. Input and output terminals of the inverters INV1_O, INV2_O are grounded through the sixth and seventh odd NMOS transistors M7_O, M8_O. Output and input terminals of the odd inverters INV1_O, INV2_O are connected to the first sense node SO1 through the fifth odd NMOS transistor M5_O. The fifth and seventh odd NMOS transistors M5_O, M8_O are respectively controlled by control signals SLDCH_O and φLATCH_O. The sixth odd NMOS transistor M7_O is controlled by a voltage on the first sense node SO1.

Continuing to refer to FIG. 5, an even page buffer PB2 also includes a bit line bias and select section, a precharge section, and a sense and latch section. The second, even page buffer PB2 is connected to a second, even-numbered bit line group BLG2 including third and fourth bit lines BL3, BL4. The second page buffer PB2 is also connected to first through seventh even NMOS transistors M1_E to M5_E, M7_E, M8_E, an even PMOS transistor M6_E, and two even inverters INV1_E, INV2_E.

The first and second even NMOS transistors M1_E, M2_E are connected in series between the third and fourth bit lines BL3, BL4 and are controlled by a respective one of the odd and even control signals BLSHLD_O, BLSHLD_E. An interconnection node N2 of the first and second even NMOS transistors M1_E, M2_E is coupled with the signal line 142. The third even NMOS transistor M3_E is connected between the third bit line BL3 and a second sense node SO2 and is turned on and off by an even-odd bias control signal BLBIAS_EO. The fourth even NMOS transistor M4_E is connected between the fourth bit line BL4 and the second sense node SO2 and is turned on and off by an even-even bias control signal BLBIAS_EE.

The first through fourth even NMOS transistors M1_E to M4_E provide the bit line bias and select section of the second page buffer PB2. The even PMOS transistor M6_E is connected between the power supply voltage Vcc and the second sense node SO2 and is controlled by an even precharge control signal nSOSHLD_E. The even PMOS transistor M6_E forms the precharge section. Input and output terminals of the first and second even inverters INV1_E, INV2_E are grounded through the sixth and seventh even NMOS transistors M7_E, M8_E, and output and input terminals thereof are connected to the second sense node SO2 through the fifth even NMOS transistor M5_E. The fifth and seventh even NMOS transistors M5_E, M8_E are respectively controlled by even control signals SLDCH_E and φLATCH_E. The sixth even NMOS transistor M7_E is controlled by a voltage on the second sense node SO2.

Figure 6:
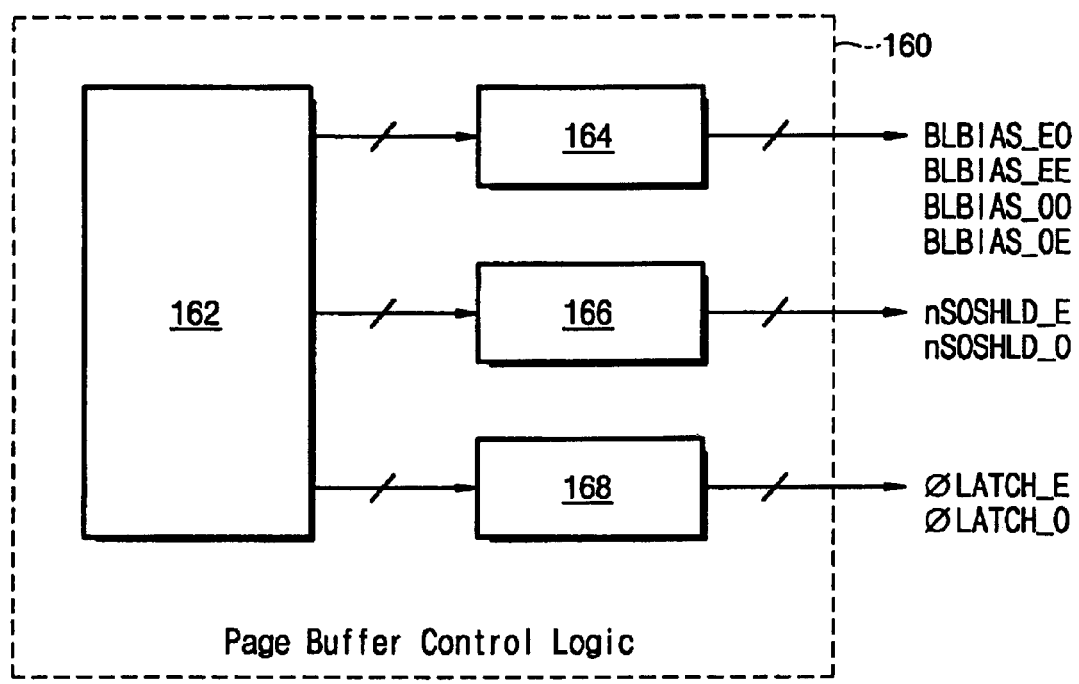
FIG. 6 is a block diagram of a page buffer control logic of the memory device of FIG. 4 according to yet another aspect of the present invention.
Figure 7:
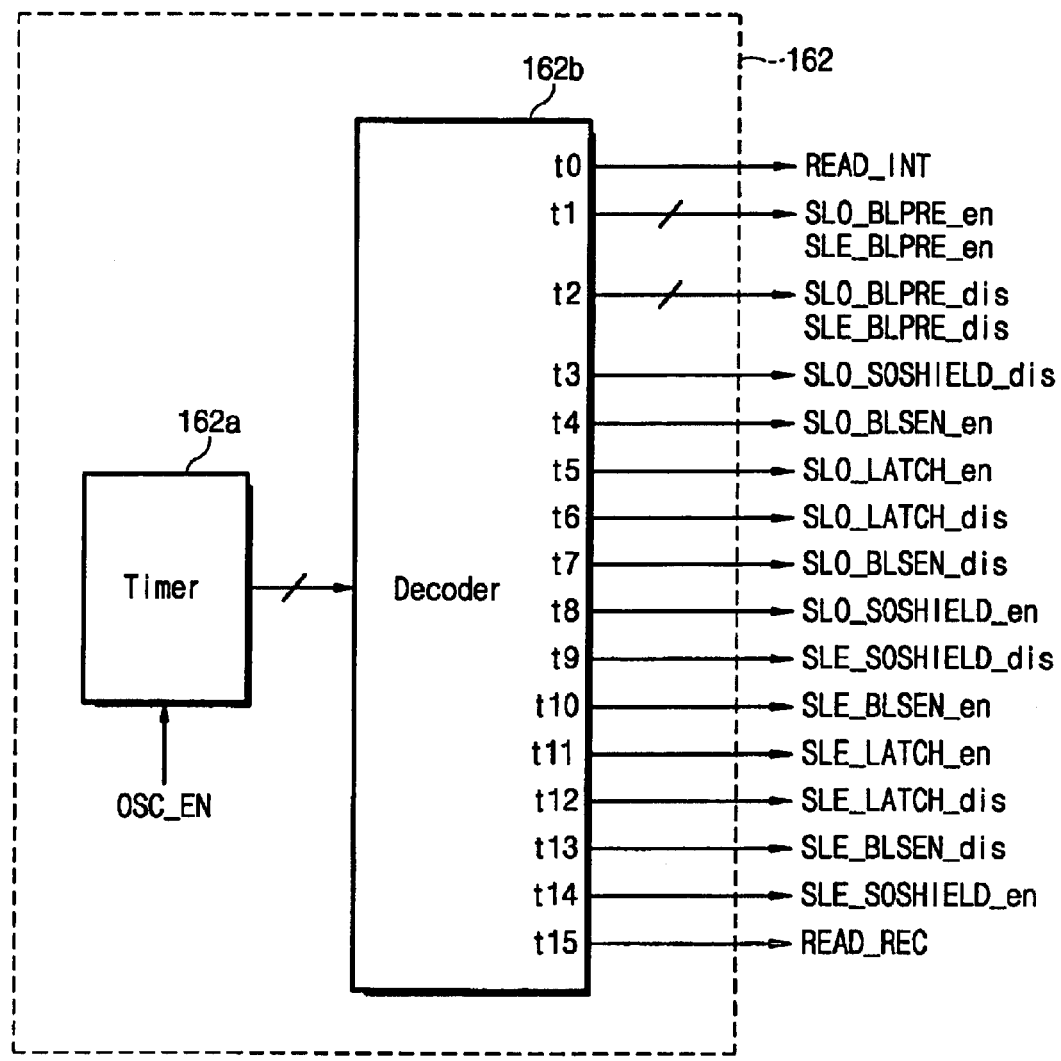
FIG. 7 is a block diagram of a sense and latch scheduler of the control logic of FIG. 6.
Figure 8:
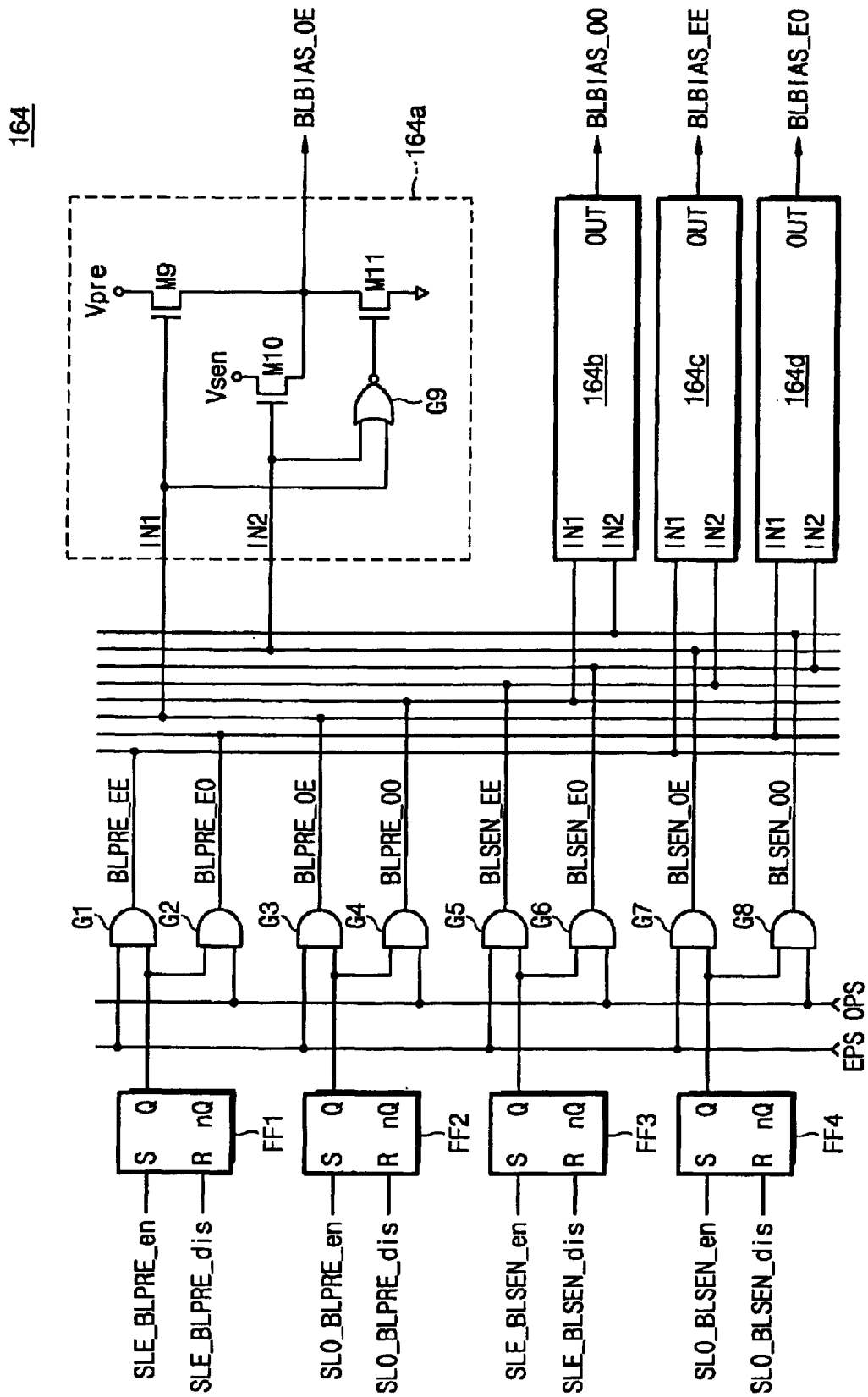
FIG. 8 is a schematic circuit diagram illustrating a preferred embodiment of a bias control signal generating section of the sense and latch scheduler of FIG. 7 according to a still further aspect of this invention.
Figure 9:
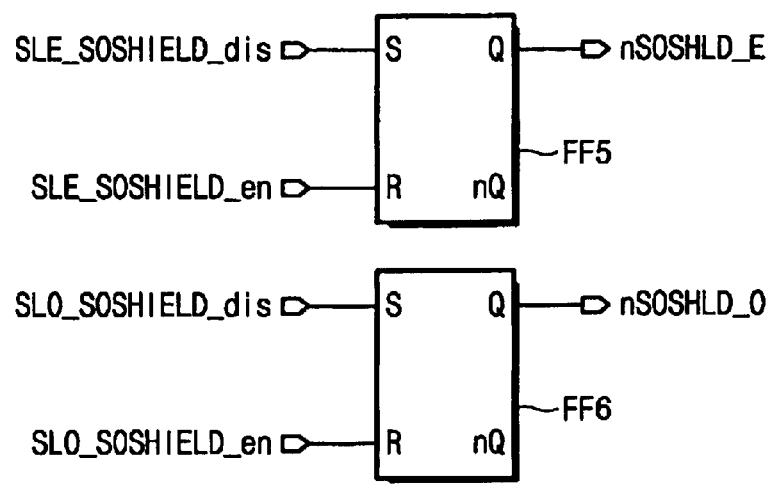
FIG. 9 is a block diagram illustrating a preferred embodiment of a precharge control signal generating section of the control logic of FIG. 6.
Figure 10:
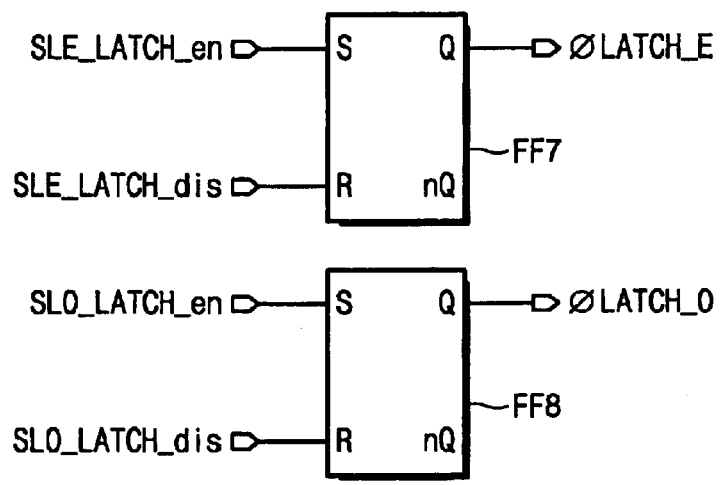
FIG. 10 is a block diagram illustrating a preferred embodiment of a latch control signal generating section of the control logic of FIG. 6.

FIG. 6 is a block diagram showing the page buffer control logic of the semiconductor memory device of FIG. 4. FIG. 7 is a block diagram showing one embodiment of a sense and latch scheduler of the control logic of FIG. 6. FIG. 8 is a block diagram illustrating one embodiment of a bias control signal generating section of the control logic of FIG. 6. FIG. 9 is a block diagram illustrating one embodiment of a precharge control signal generating section of the control logic of FIG. 6. FIG. 10 is a block diagram illustrating one embodiment of a latch control signal generating section of the control logic of FIG. 6. The construction of the page buffer control logic according to another aspect of the present invention will now be described with reference to FIGS. 6 to 10.

Referring to FIG. 6, the page buffer control logic 160 includes a sense and latch scheduler 162. The sense and latch scheduler 162, as further illustrated in FIG. 7, includes a timer 162a and a decoder 162b and generates a plurality of pulse signals when a control signal OSC_EN is activated. Referring specifically to FIG. 7, "SLO" indicates an odd-numbered sense and latch section, and "SLE" indicates an even-numbered sense and latch section.

The timer 162a generates an n-bit signal or n number of bit signals in response to the control signal OSC_EN. The decoder 162b decodes output signals of the timer 162a to generate the sequentially-activated pulse signals. The timer 162a and the decoder 162b are well-known to those skilled in the art, and a detailed description thereof will therefore be omitted. The timer 162a could, for example, be implemented using an n-bit counter. Output terminals of the decoder 162b are labeled with timing markings "t0"–"t15" to indicate an activation order of the output signals of the decoder 162b.

The page buffer control logic 160, as illustrated in FIG. 6, further includes a bias control signal generator 164, which responds to the output signals of the sense and latch scheduler 162 to generate bias control signals BLBIASS_EE, BLBIAS_EO, BLBIAS_OO, BLBIAS_OE. Referring to FIG. 8, the bias control signal generator 164 comprises four S-R flip-flops FF1 to FF4, eight AND gates G1 to G8, and four signal generators 164a to 164d, which are connected as illustrated. The signal generator 164a includes three NMOS transistors M9, M10, M11 and a NOR gate G9, arranged as illustrated. The other signal generators 164b to 164d are constructed the same as the signal generator 164a.

Referring again to FIG. 6, the page buffer control logic 160 further includes a precharge control signal generator 166 and a latch control signal generator 168. The precharge control signal generator 166 generates even and odd precharge control signals nSOSHLD_E, nSOSHLD_O under the control of the sense and latch scheduler 162. The precharge control signal generator 166 includes two S-R flip-flops FF5, FF6, connected as illustrated in FIG. 9.

The latch control signal generator 168 generates even and odd latch control signals φLATCH_E, φLATCH_O under the control of the sense and latch scheduler 162. The latch control signal generator 168 includes two S-R flip-flops FF7, FF8, arranged as illustrated in FIG. 10.

Figure 11:
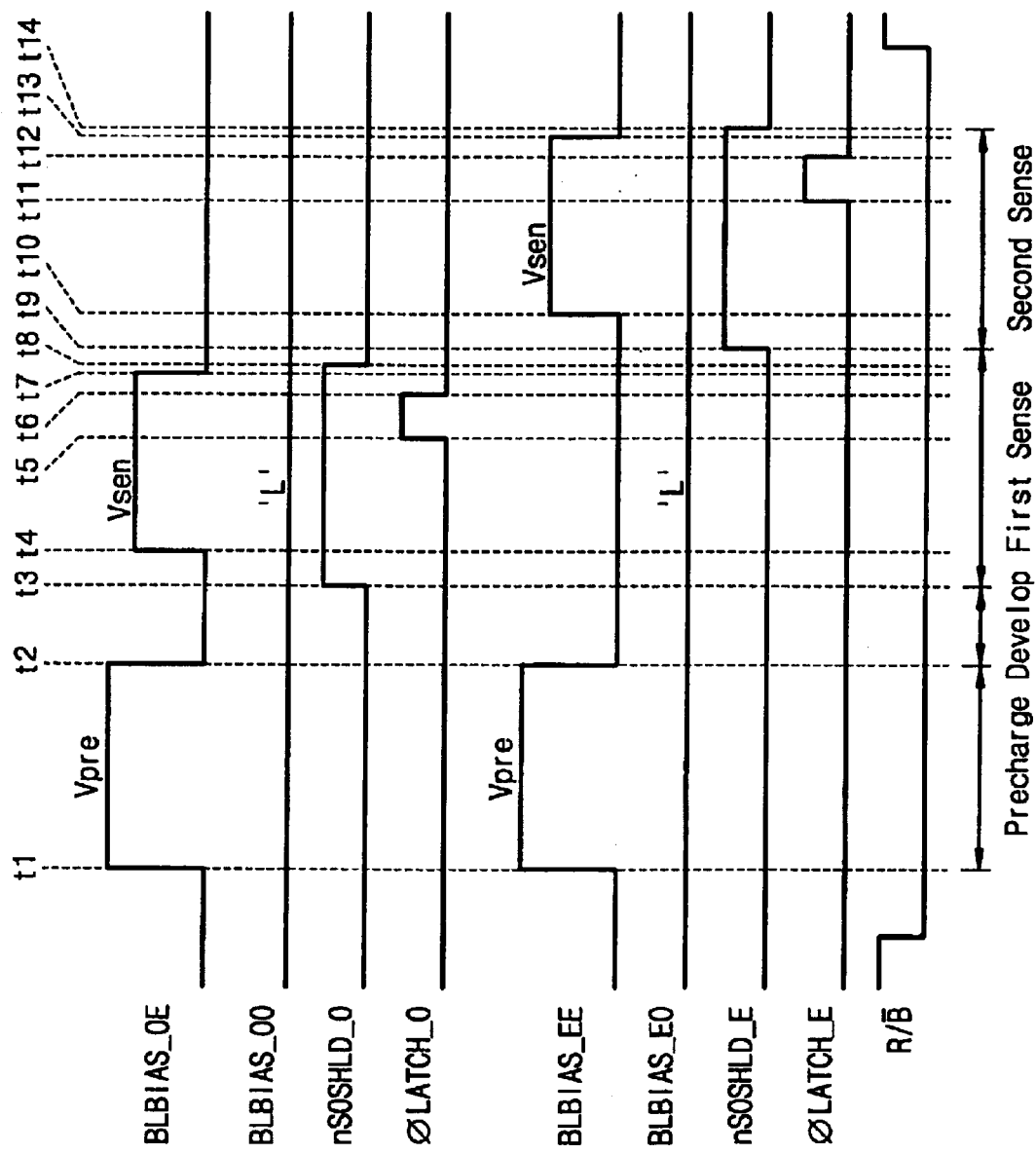
FIG. 11 is a timing diagram illustrating signals of a read operation of a non-volatile semiconductor memory device according to the various aspects and embodiments of the present invention illustrated in FIGS. 6–10.

A read operation, according to one aspect of the present invention, will now be described. FIG. 11 is a timing diagram illustrating signals of a read operation according to an aspect of the present invention. As is well-known, a NAND-type flash memory device supports a page read operation, in which data bits stored in memory cells of one page are read out through the page buffer circuit 140. Referring to FIG. 5, two bit lines share one page buffer. This means that bit lines are arranged in the memory cell array 100 so as to correspond to two pages. Where a page read operation command is externally supplied, in order to read data of one page amount, odd-numbered or even-numbered ones of the bit lines BL1 to BLn are selected based on a page address. The selected bit lines correspond to one page.

For example, if a read operation starts and even-numbered bit lines are selected, an even-numbered page select signal EPS has a high level and an odd-numbered page select signal OPS has a low level. The read operation in which even-numbered bit lines are selected will be described in detail below.

Referring to FIGS. 4–11 when the read operation commences, the timer 162a of the sense and latch scheduler 162 operates responsive to the control signal OSC_EN, and the decoder 162b decodes output signals of the timer 162a. The read operation is carried out based on the decoding result. If the sense and latch scheduler 162 outputs an active high pulse signal READ_INT, latch values Q1 to Qx of the page buffers PB1 to PBx and voltages of the bit lines BL1 to BLn are simultaneously initialized.

At time t1, the odd and even pulse signals SLO_BLPRE_en, SLE_BLPRE_en from the sense and latch scheduler 162 are simultaneously activated, causing output signals of the S-R flip-flops FF1, FF2 to transition from a low level to a high level. Since the even-numbered page select signal EPS is at the high level and the odd-numbered page select signal OPS is at the low level, output signals BLPRE_EE, BLPRE_OE of the first and third AND gates G1, G3 go high and output signals of the other AND gates G2 and G4 to G8 go low.

As the even-even bit line precharge signal BLPRE_EE from the first AND gate G1 becomes high, the first NMOS transistor M9 of the even-even signal generator 164c is turned on and the third NMOS transistor M11 thereof is turned off. At this time, since the even-even bit line sense signal BLSEN_EE of the fifth AND gate G5 is low, the second NMOS transistor M10 of the even-even signal generator 164c is turned off. As a result, the even-even signal generator 164c outputs the even-even bias control signal BLBIAS_EE having a precharge voltage level Vpre.

Similarly, as an odd-even bit line precharge signal BLPRE_OE of the third AND gate G3 goes high, the first NMOS transistor M9 of the odd-even signal generator 164a is turned on and its third NMOS transistor M11 is turned off. At this time, since an odd-even bit line sense signal BLSEN_OE, output from the seventh AND gate G7, is low, the second NMOS transistor M10 of the odd-even signal generator 164a is turned off. As a result, the odd-even signal generator 164a outputs the odd-even bias control signal BLBIAS_OE having the precharge voltage level Vpre.

The third NMOS transistors M11 of the odd-odd and even-odd signal generators 162b, 162d are turned on by their own input signals IN1, IN2. The odd-odd and even-odd signal generators 162b, 162d therefore output odd-odd and even-odd bias control signals BLBIAS_OO, BLBIAS_EO, respectively, each having a ground voltage level GND. Each of the other output signals of the page buffer control logic 160, besides the even-even and odd-even bias control signals BLBIAS_EE, BLBIAS_OE, are also maintained low.

When even-numbered bit lines BL2, BL4, BL6, etc. are selected, the odd-numbered bit lines BL1, BL3, BL5, etc. are fixed at the ground voltage level GND. This is accomplished by raising an odd bit line shield signal BLSHLD_O to a high level and lowering an even bit line shield signal BLSHLD_E to a low level. As the odd bit line shield signal BLSHLD_O becomes high, all of the first odd and even NMOS transistors M1_O, M1_E of the page buffers PB1 to PBx are turned on. The odd-numbered bit lines BL1, BL3, BL5, etc. are thereby connected to the signal line 142 having a ground voltage level GND.

As described above, when the odd-even and even-even bias control signals BLBIAS_OE, BLBIAS_EE reach the precharge voltage level Vpre, the fourth NMOS transistors M4_O, M4_E of the page buffers PB1 to PBx are all turned on. While the precharge control signals nSOSHLD_O, nSOSHLD_E are maintained low, the sense nodes SO1 to SOx of the page buffers PB1 to PBx are charged up to the power supply voltage Vcc through corresponding precharge transistors M6_O, M6_E. At the same time, since gate voltages of the fourth NMOS transistors M4_O, M4_E are equal to the precharge voltage Vpre, which is lower than the power supply voltage Vcc, the even-numbered bit lines are charged up to the precharge voltage Vpre. The fourth NMOS transistors M4_O, M4_E are thereby shut off.

At time t2, the sense and latch scheduler 162 generates active high odd and even pulse signals SLO_BLPRE_dis, SLE_BLPRE_dis, which causes output signals of the S-R flip-flops FF1, FF2 to go low. The bit line precharge signals BLPRE_EE, BLPRE_OE of the first and third AND gates G1, G3 also become low. The first NMOS transistor M9 of the odd-even signal generator 164a is turned off by the low-level odd-even bit line precharge signal BLPRE_OE, while its third NMOS transistor M11 is turned on by the low-level bit line precharge and bit line sense signals BLPRE_OE, BLSEN_OE.

Similarly, the first NMOS transistor M9 of the even-even signal generator 164c is turned off by the low even-even bit line precharge signal BLPRE__EE, while its third NMOS transistor M11 is turned on by the low-level bit line precharge and bit line sense signals BLPRE__EE, BLSEN__EE. The odd-even and even-even bias control signals BLBIAS__OE, BLBIAS__EE thereby transition from the high precharge voltage level Vpre to the low ground voltage level GND.

At time t3, the sense and latch scheduler 162 outputs an odd pulse signal SLO__SOSHIELD__dis. An output signal nSOSHLD__O of the S-R flip-flop FF6 of the precharge control signal generator 166 transitions from the low level to the high level based on the active high odd pulse signal SLO__SOSHIELD__dis. The precharge transistors M6__O of the odd-numbered page buffers are thereby turned off.

While the odd-even and even-even bias control signals BLBIAS__OE, BLBIAS__EE are maintained low, the voltages of the even-numbered bit lines BL2, BL4, BL6, etc. are varied based on states of corresponding memory cells. For example, the precharge voltage of a bit line connected to an ON cell is lowered, while the precharge voltage of a bit line connected to an OFF cell is maintained. A period from time t1 to t2 is referred to as "a bit line precharge period." A period from time t2 to t3 is called "a bit line develop period."

At time t4, the sense and latch scheduler 162 generates a different pulse signal SLO__BLSEN__en, causing the S-R flip-flop FF4 of the bias control signal generator 164 to output a high level signal. As a result, an odd-even bit line sense signal BLSEN__OE of the seventh AND gate G7 goes high, causing the second NMOS transistor M10 of the odd-even signal generator 164a to be turned on. While the second NMOS transistor M10 is turned on, the odd-even bias control signal BLBIAS__OE has a sense voltage Vsen lower than the precharge voltage Vpre. A voltage, corresponding to the voltage from the fourth odd NMOS transistor M4__O, is discharged from the first sense node SO1.

The first sense node SO1 is controlled by the odd-even bias control signal BLBIAS__OE and is connected to a bit line (e.g., BL2) of an ON cell. A voltage corresponding to the voltage of the fourth odd NMOS transistor M4__O of the third page buffer PB3 is maintained on the third sense node SO3. The third sense node SO3 is controlled by the bias control signal BLBIAS__OE and is connected to a bit line (e.g., BL6) of an OFF cell. A gate voltage of the fourth odd NMOS transistor M4__O of the third page buffer PB3 is the sense voltage Vsen, its source voltage is the precharge voltage Vpre, and its drain voltage is the power supply voltage Vcc. The NMOS transistor M4__O is therefore shut off.

At time t5, the latch control signal generator 168 responds to an active high pulse signal SLO__LATCH__en from the sense and latch scheduler 162 to transition an odd latch control signal φLATCH__O from low to high. The seventh NMOS transistors M8__O of the odd-numbered page buffers are turned on by the high-level odd latch control signal φLATCH__O. For example, the voltage of a sense node (e.g., SO1) corresponding to an ON cell is lower than a threshold voltage of a transistor. The sixth NMOS transistor M7__O, connected to an ON cell, is therefore turned off. As a result, a value of a first latch Q1 (formed from first and second odd inverters INV1__O, INV2__O), in the first page buffer PB1, is maintained at a low level ("0").

The voltage of a third sense node SO3, which corresponds to an OFF cell, on the other hand, is maintained at the power supply voltage Vcc. Because this voltage is higher than the threshold voltage of the sixth NMOS transistor M7__O connected to the OFF cell, that transistor is turned on. As a result, a value of a third latch Q3, in the third page buffer PB3, transitions from "0" to "1".

At time t6, the sense and latch scheduler 162 generates a pulse signal SLO__LATCH__dis, which causes the S-R flip-flop FF8 of the latch control signal generator 168 to output a low level odd latch signal φLATCH__O. The seventh NMOS transistors M8__O of the odd-numbered page buffers are simultaneously turned off. At time t7, the sense and latch scheduler 162 generates a pulse signal SLO__BLSEN__dis, which causes output signals of the S-R flip-flop FF4 and the seventh AND gate G7 to transition from high to low.

When the odd-even bit line sense signal BLSEN__OE transitions from high to low, the odd-even signal generator 164a outputs an odd-even bias control signal BLBIAS__OE having a ground voltage. The fourth NMOS transistors M4__O that correspond to the odd-numbered page buffers are turned off in response to the odd-even bias control signal BLBIAS__OE.

At time t8, the precharge control signal nSOSHLD__O transitions from high to low. More specifically, as the sense and latch scheduler 162 generates the pulse signal SLO__SOSHELD__en at time t8, the S-R flip-flop FF6 of the precharge control signal generator 166 outputs a low level signal nSOSHLD__O. This causes the precharge transistors M6__O of the odd-numbered page buffers PB1, PB3, PB5, etc. to turn on. The odd-numbered sense nodes SO1, SO3, SO5, etc. are thereby charged up to the power supply voltage Vcc. The period from t4 to t8 is called a "first sense period."

During the first sense period, in which the odd-numbered page buffers PB1, PB3, PB5, etc. operate, the precharge control signal nSOSHLD__E is maintained low. The precharge transistors M6__E of the even-numbered page buffers PB2, PB4, PB6, etc. are turned on by the low level precharge control signal nSOSHLD__E. The even-numbered sense nodes SO2, SO4, SO6, etc. in the even-numbered page buffers are maintained at a specific voltage (e.g., the power supply voltage) during the first sense period.

In other words, unlike the prior art, when adjacent page buffers perform their sense operations, a floated sense node (corresponding to a bit line connected to an OFF cell) is not affected by voltage variation of a sense node corresponding to an ON cell. This is because sense nodes adjacent to the floated sense node are fixed at the specific voltage (e.g., the power supply voltage). For example, where an odd sense node SO3 that corresponds to an OFF cell is floated, adjacent even sense nodes SO2, SO4 are fixed at a specific voltage (e.g., the power supply voltage). Therefore, the floated sense node SO3 is not affected by voltage variation of an odd sense node SO1 connected to an ON cell. In this manner, induction of read error can be prevented.

At time t9, the sense and latch scheduler 162 outputs an active high pulse signal SLE__SOSHIELD__dis and an output signal nSOSHLD__E of the S-R flip-flop FF5 in the precharge control signal generator 166 transitions from low to high. The precharge transistors M6__E of the even-numbered page buffers are thereby turned off.

At time t10, the sense and latch scheduler 162 generates an active high pulse signal SLE__BLSEN__en and an output signal of the S-R flip-flop FF3 of the bias control signal generator 164 goes high. This causes an even-even bit line sense signal BLSEN__EE of the AND gate G5 to go high, and the second NMOS transistor M10 of the even-even signal generator 164c is thereby turned on. The even-even bias control signal BLBIAS__EE has the sense voltage Vsen, which is lower than the precharge voltage Vpre. At this time, a voltage on a sense node connected to an ON cell is rapidly lowered while a high-level voltage on a sense node corresponding to an OFF cell is maintained.

The second sense node SO2, for instance, is connected through the fourth even NMOS transistor M4_E of the second page buffer PB2 to a fourth bit line BL4. The fourth bit line BL4 is connected to an ON cell. The fourth NMOS transistor M4_E is controlled by the even-even bias control signal BLBIAS_EE. A voltage on the second sense node SO2 is rapidly lowered.

A high-level voltage (e.g., Vcc) on a sense node corresponding to an OFF cell, on the other hand, is maintained. For instance, the fourth sense node SO4 is connected to the fourth even NMOS transistor M4_E of the fourth page buffer PB4. The fourth even NMOS transistor M4_E is connected to an eighth bit line BL8, which is connected to the OFF cell. The transistor is controlled by the bias control signal BLBIAS_EE. The voltage on the fourth sense node SO4 is maintained.

The latch control signal generator 168, at time t11, causes an even latch control signal φLATCH_E to transition from low to high in response to the pulse signal SLE_LATCH_en from the sense and latch scheduler 162. The seventh even NMOS transistors M8_E of the even-numbered page buffers are turned on by the high-level latch control signal φLATCH_E. For example, since a voltage on an even sense node (e.g., SO2) corresponding to an ON cell drops below the threshold voltage of the sixth even NMOS transistor M7_E, that transistor is turned off. An initial low value of a second latch Q2, formed from two inverters INV1_E, INV2_E, is maintained. On the other hand, since a voltage on an even sense node (e.g., SO4) corresponding to an OFF cell is maintained at the power supply voltage, which is higher than a trip voltage of the seventh even NMOS transistor M7_E, that transistor is turned on. An initial value of a corresponding latch Q4, also formed from two inverters INV1_E, INV2_E, thereby inverts from "0" to "1".

At time t12, the sense and latch scheduler 162 generates a pulse signal SLE_LATCH_dis, which causes the even latch control signal φLATCH_E of the S-R flip-flop FF7 in the latch control signal generator 168 to become low. The seventh even NMOS transistors MS_E of the even-numbered page buffers are simultaneously turned off by the low level latch control signal φLATCH_E.

At time t13, the sense and latch scheduler 162 generates a pulse signal SLE_BLSEN_dis, which causes output signals of the third S-R flip-flop FF3 and the fifth AND gate G5 to transition from high to low. As a result, the signal generator 164c outputs the even-even bias control signal BLBIAS_EE with a ground voltage level. The fourth even NMOS transistors M4_E of the even-numbered page buffers are turned off by the low level bias control signal BLBIAS_EE.

At time t14, the precharge control signal nSOSHLD_E transitions from the high level to the low level. In particular, as the sense and latch scheduler 162 generates a pulse signal SLE_SOSHIELD_en, an output signal nSOSHLD_E of the S-R flip-flop FF5 in the precharge control signal generator 166 becomes low. The precharge transistors M6_E of the even-numbered page buffers are turned on by the low level signal nSOSHLD_E, and the even-numbered sense nodes SO2, SO4, SO6, etc. are charged up to the power supply voltage Vcc. A time period from t9 to t14 is called "a second sense period."

During the second sense period, the even-numbered page buffers PB2, PB4, PB6, etc. operate, and the precharge control signal nSOSHLD_O is maintained low. The precharge transistors M6_O of the odd-numbered page buffers PB1, PB3, PB5, etc. are turned on by the low level precharge control signal nSOSHLD_O. The odd-numbered sense nodes SO1, SO3, SO5, etc. are thereby maintained at a specific voltage (e.g., the power supply voltage) during the first sense period. In other words, unlike the prior art, when adjacent page buffers perform their sense operations, a floated sense node (corresponding to a bit line connected to an OFF cell) is not affected by voltage variation of a sense node corresponding to an ON cell. This is because sense nodes adjacent to the floated sense node are fixed at the specific voltage (e.g., the power supply voltage). For example, when a fourth sense node SO4 is floated, adjacent sense nodes SO3, SO5 are fixed at a specific voltage (e.g., the power supply voltage), so that the floated sense node SO4 is not affected by the voltage variation of the sense node SO2 connected to the ON cell.

Finally, at time t15, the sense and latch scheduler 162 generates an active high pulse signal READ_REC, and a well-known recovery or discharge operation is carried out. During the recovery operation, voltages on the bit lines and the word lines are initialized.

In this embodiment, voltages on sense nodes (e.g., SO1 to SO4) at each period are summarized as follows:

TABLE

| Period | Node | | | |
| --- | --- | --- | --- | --- |
| | SO1 | SO2 | SO3 | SO4 |
| Precharge | Vcc | Vcc | Vcc | Vcc |
| Develop | Vcc | Vcc | Vcc | Vcc |
| First sense | 0V or Vcc | Vcc(shield) | 0V or Vcc | Vcc(shield) |
| Second sense | Vcc(shield) | 0V or Vcc | Vcc(shield) | 0V or Vcc |

As described above, during the first sense period, the even-numbered sense nodes SO2, SO4, of the even-numbered page buffers PB2, PB4, are fixed at the power supply voltage Vcc through corresponding precharge transistors M6_E. During the second sense period, the odd-numbered sense nodes SO1, SO3, of the odd-numbered page buffers PB1, PB3, are fixed at the power supply voltage Vcc through corresponding precharge transistors M6_O. It should be apparent to those skilled in the art that other methods can be used to fix the odd-numbered and even-numbered sense nodes at a specific voltage.

For example, during the first sense period, the sense nodes SO2, SO4 of the even-numbered page buffers PB2, PB4 are fixed at the power supply voltage Vcc through corresponding precharge transistors M6_E. During the second sense period, on the other hand, the sense nodes SO1, SO3 of the odd-numbered page buffers PB1, PB3 can be fixed at either the power supply voltage or the ground voltage according to values held in corresponding latches. This alternative embodiment will be more fully described below.

Figure 12:
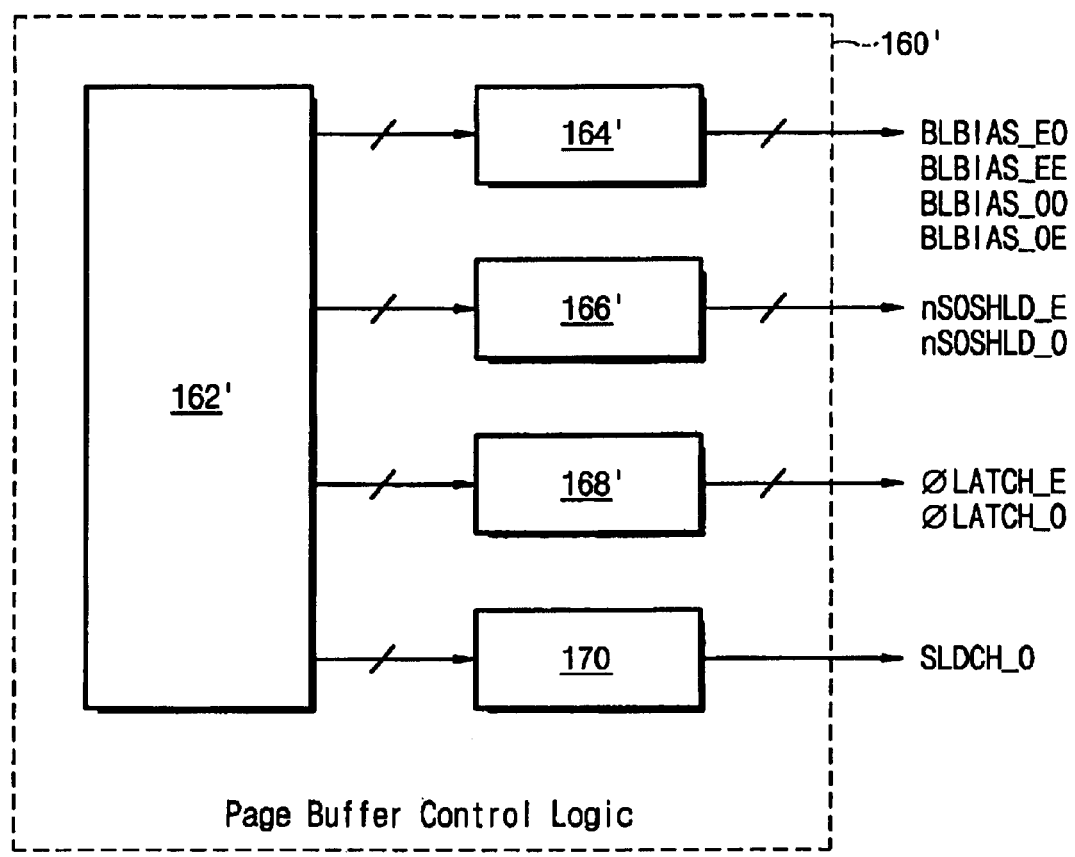
FIG. 12 is a block diagram showing a page buffer control logic according to another embodiment of the present invention.

FIG. 12 is a block diagram showing a page buffer control logic according to another embodiment of the present invention. A non-volatile semiconductor memory device according to this embodiment includes the same constituents as the previous embodiment. More particularly, the non-volatile semiconductor memory device according to this embodiment includes a memory cell array, a row decoder circuit, and a page buffer circuit similar to those described with respect to the previous embodiment.

Referring to FIG. 12, a page buffer control logic 160' according to the second embodiment includes a sense and latch scheduler 162', a bias control signal generator 164', a precharge control signal generator 166', a latch control signal generator 168', and a latch select signal generator 170. The bias control signal generator 164', the precharge control signal generator 166', and the latch control signal generator 168' are configured substantially the same as their counterparts 164, 166, and 168, respectively, in the previous embodiment. A description of these elements is therefore omitted here.

Figure 13:
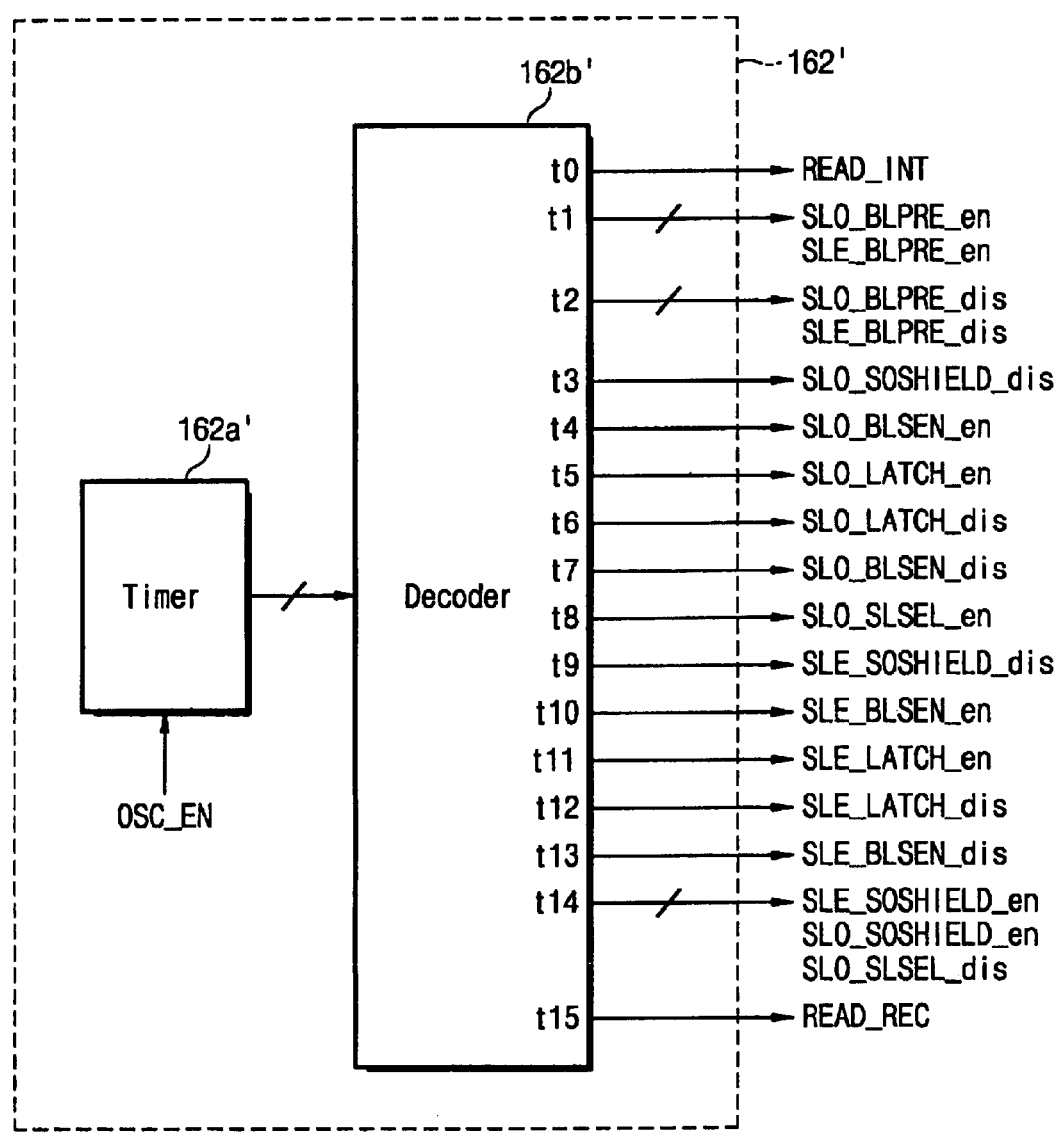
FIG. 13 is a block diagram of a sense and latch scheduler of the control logic of FIG. 12.

FIG. 13 is a block diagram of a sense and latch scheduler 162' of the page buffer control logic of FIG. 12. Referring to FIGS. 12 and 13, the sense and latch scheduler 162' includes a timer 162a' and a decoder 162b' and generates a plurality of pulse signals in response to a control signal OSC_EN. The timer 162a' generates an n-bit signal (or n number of bit signals) in response to the control signal OSC_EN. The decoder 162b' decodes output signals of the timer 162a' to generate pulse signals that are sequentially activated. The timer 162a' and the decoder 162b' are well-known to those skilled in the art, and detailed descriptions thereof will therefore be omitted herein. The timer 162a', for example, can be implemented using an n-bit counter. Labels "t0" to "t15" on output terminals of the decoder 162b' indicate an activation order of output signals thereof, as will be more fully described below.

Figure 14:
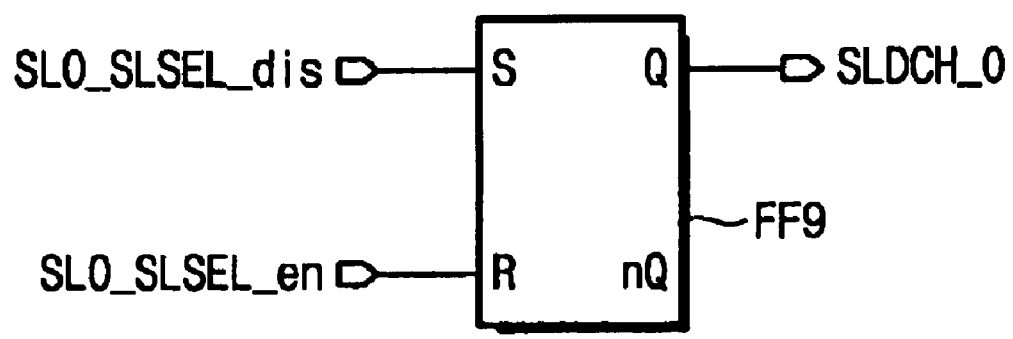
FIG. 14 is a block diagram of a preferred embodiment of a latch select signal generating section of the control logic of FIG. 12.

FIG. 14 is a circuit diagram of a latch select signal generator 170 of the page buffer control logic of FIG. 12. Referring to FIG. 14, the latch select signal generator 170 includes a ninth S-R flip-flop FF9 and generates a latch select signal SLDCH_O in response to pulse signals SLO_SLSEL_dis, SLO_SLSEL_en from the sense and latch scheduler 162'.

Figure 15:
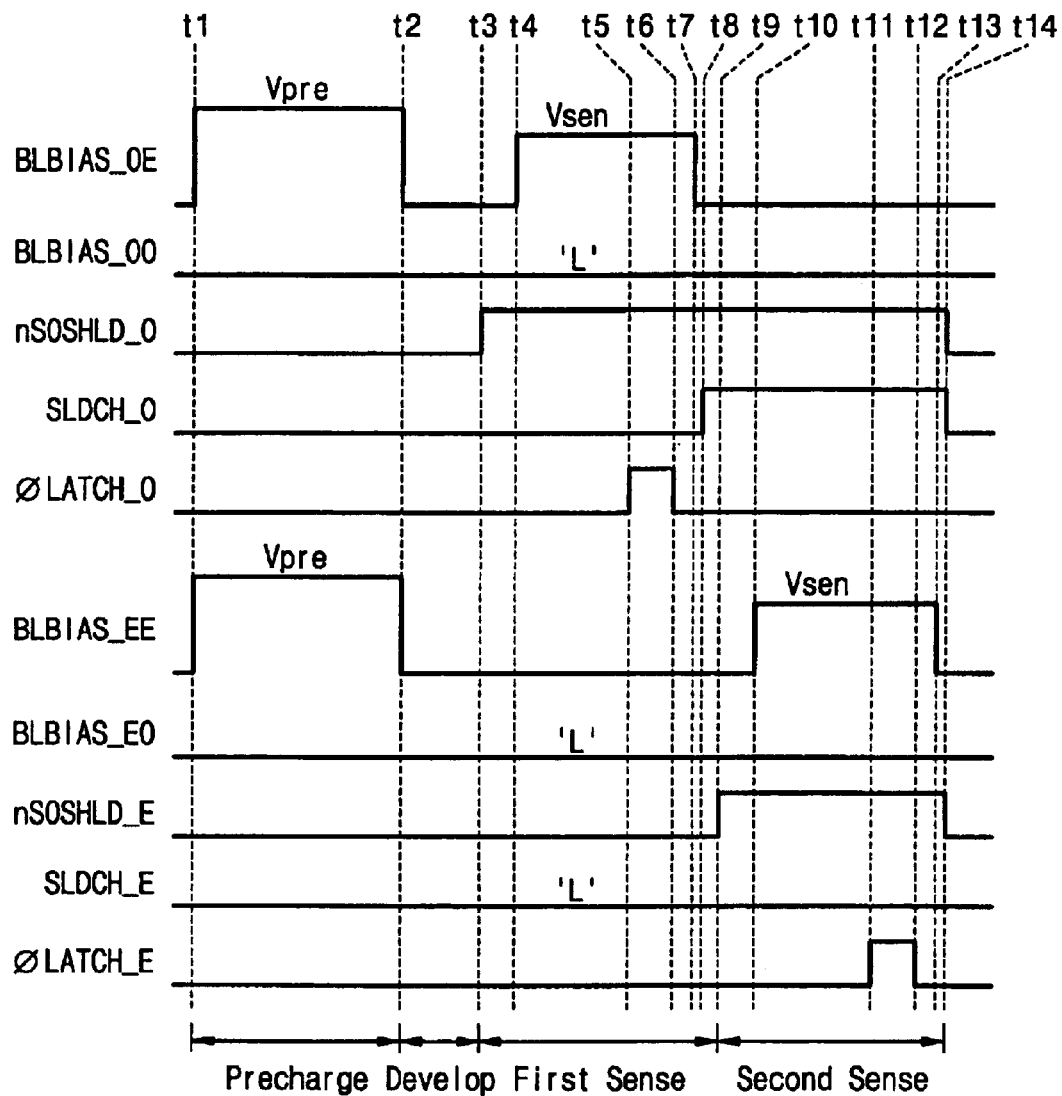
FIG. 15 is a timing diagram illustrating signals of a read operation of a non-volatile semiconductor memory device according to the various aspects and embodiments of the present invention illustrated in FIGS. 12–14.

FIG. 15 is a timing diagram illustrating signals of a read operation in this embodiment of the invention. In the following explanation, the read operation starts by selecting even-numbered bit lines, although the read operation could also start by selecting odd-numbered bit lines. Since even-numbered bit lines are selected, an even-numbered page select signal EPS has a high level, while an odd-numbered page select signal OPS has a low level.

Referring to FIGS. 12–15, when the read operation commences, the timer 162a' of the sense and latch scheduler 162' operates responsive to the control signal OSC_EN, and the decoder 162b' thereof decodes output signals of the timer 162a'. The read operation is carried out based on the decoding result. First, when the sense and latch scheduler 162' outputs an active high pulse signal READ_INT, latch values Q1 to Qx of the page buffers PB1 to PBx and voltages of the bit lines BL1 to BLn are initialized at the same time. Voltages to be supplied to word lines may also be prepared at this time.

At time t1, the pulse signals SLO_BLPRE_en, SLE_BLPRE_en from the sense and latch scheduler 162' are simultaneously activated, causing output signals of the S-R flip-flops FF1, FF2 of the bias control signal generator 164' to transition from low to high. Since the even-numbered page select signal EPS is at a high level and the odd-numbered page select signal OPS is at a low level, output signals BLPRE_EE, BLPRE_OE of the first and third AND gates G1, G3 become high while output signals of the other AND gates G2 and G4 to G8 become low.

As the even-even output signal BLPRE_EE of the first AND gate G1 becomes high, the first NMOS transistor M9 of the signal generator 164c is turned on and the third NMOS transistor M11 thereof is turned off. At this time, since the output signal BLSEN_EE of the fifth AND gate G5 is at the low level, the second NMOS transistor M10 of the signal generator 164c is turned off. As a result, the signal generator 164c outputs an even-even bias control signal BLBIAS_EE having a precharge voltage level Vpre.

Similarly, as the odd-even output signal BLPRE_OE of the third AND gate G3 goes high, the first NMOS transistor M9 of the signal generator 164a is turned on and its third NMOS transistor M11 is turned off. At this time, since an output signal BLSEN_OE of the seventh AND gate G7 is at the low level, the second NMOS transistor M10 of the signal generator 164a is turned off. As a result, the signal generator 164a outputs an odd-even bias control signal BLBIAS_OE also having the precharge voltage Vpre level.

At this time, the other signal generators 162b, 162d output bias control signals BLBIAS_OO, BLBIAS_EO each having a ground voltage GND level because the second NMOS transistors M11 therein are turned on by their own input signals IN1, IN2. Output signals of the page buffer control logic 160', other than the even-even and odd-even bias control signals BLBIAS_EE, BLBIAS_OE, are maintained low.

As described above, because the odd-even and even-even bias control signals BLBIAS_OE, BLBIAS_EE have the precharge voltage level Vpre, the fourth NMOS transistors M4_O, M4_E of each of the page buffers PB1 to PBx are turned on. While the odd and even precharge control signals nSOSHLD_O, nSOSHLD_E are maintained low, the sense nodes SO1 to SOx of the page buffers PB1 to PBx are charged up to the power supply voltage Vcc through corresponding precharge transistors M6_O, M6_E. At the same time, since gate voltages of the fourth NMOS transistors M4_O, M4_E are at the precharge voltage level Vpre, which is lower than the power supply voltage Vcc, the even-numbered bit lines are charged up to the precharge voltage level Vpre. After the even-numbered bit lines are charged up to the precharge voltage Vpre, the fourth NMOS transistors M4_O, M4_E are shut off.

At time t2, the sense and latch scheduler 162' generates active high pulse signals SLO_BLPRE_dis, SLE_BLPRE_dis and output signals of the S-R flip-flops FF1, FF2 in the bias control signal generator 164' go low, causing output signals BLPRE_EE, BLPRE_OE of the first and third AND gates G1, G3 to also become low. The first NMOS transistor M9 of the signal generator 164a is turned off by the low level even-even bit line precharge signal BLPRE_EE, while its third NMOS transistor M11 is turned on by the low level even-even bit line precharge and bit line sense signals BLPRE_EE, BLSEN_EE. Similarly, the first NMOS transistor M9 of the signal generator 164c is turned off by a low level odd-even bit line precharge signal BLPRE_OE, while its third NMOS transistor M11 is turned on by low level signals BLPRE_OE, BLSEN_OE. The odd-even and even-even bias control signals BLBIAS_OE, BLBIAS_EE therefore transition from the high precharge voltage level Vpre to the low ground voltage level GND.

At time t3, the sense and latch scheduler 162' outputs an active high pulse signal SLO_SOSHIELD_dis, and an output signal nSOSHLD_O of the S-R flip-flop FF6 in the precharge control signal generator 166 transitions from low to high. The precharge PMOS transistors M6_O of the odd-numbered page buffers are thereby turned off. While the bias control signals BLBIAS_OE, BLBIAS_EE are maintained low, the voltages of the even-numbered bit lines BL2, BL4, BL6, etc. are varied based on states of corresponding memory cells. For example, the precharge voltage of a bit line connected to an ON cell is lowered, while the precharge voltage of a bit line connected to an OFF cell is maintained. A first period t1 is called "a bit line precharge period", and a second period, from t2 to t3, is called "a bit line develop period."

At time t4, the sense and latch scheduler 162' generates an active high pulse signal SLO_BLSEN_en, and the fourth S-R flip-flop FF4 of the bias control signal generator 164' outputs a high level signal. This causes an odd-even output signal BLSEN_OE of the seventh AND gate G7 to go high, such that the second NMOS transistor M10 of the signal generator 164a is turned on. As the second NMOS transistor M10 is turned on, the odd-even bias control signal BLBIAS_OE has a sense voltage Vsen that is lower than the precharge voltage Vpre. The first sense node SO1 is connected to the drain of the fourth NMOS transistor M4_O in the first page buffer PB1. The odd fourth NMOS transistor M4_O has a source connected to a bit line (e.g., BL2) of an ON cell and a gate controlled by the odd-even bias control signal BLBIAS_OE. As a result, the voltage on the first sense node SO1, corresponding to an ON cell, is rapidly discharged.

The third sense node SO3 is connected to the drain of the fourth NMOS transistor M4_O in the third page buffer PB3. A gate of the fourth odd transistor M4_O is controlled by the bias control signal BLBIAS_OE. The source of this transistor is connected to a bit line (e.g., BL6) of an OFF cell. A gate voltage of the transistor is the sense voltage Vsen, its source voltage is the precharge voltage Vpre, and its drain voltage is the power supply voltage Vcc. The fourth NMOS transistor M4_O of the third page buffer PB3 is therefore shut off and the voltage on the third sense node SO3, corresponding to an OFF cell, is therefore maintained.

The latch control signal generator 168', at time t5, responds to an active high pulse signal SLO_LATCH_en from the sense and latch scheduler 162' to generate an odd latch control signal φLATCH_O that transitions from low to high. The seventh NMOS transistors M8_O of the odd-numbered page buffers are turned on by the high-level odd latch control signal φLATCH_O.

Since the voltage of a first sense node SO1, corresponding to an ON cell, is lower than a threshold voltage of the sixth NMOS transistor M7_O, that transistor is turned off. An initial value ("0") of a corresponding inverter latch Q1 is therefore maintained without variation. Since the voltage of a third sense node SO3, corresponding to an OFF cell, is maintained at the power supply voltage Vcc, which is higher than the threshold voltage of the sixth NMOS transistor M7_O, that transistor is turned on. As a result, a value of a corresponding inverter latch Q3 transitions from "0" to "1".

At time t6, the sense and latch scheduler 162' generates a pulse signal SLO_LATCH_dis, which causes the S-R flip-flop FF8 of the latch control signal generator 168' to output a low level odd latch control signal φLATCH_O. The seventh NMOS transistors M8_O of the odd-numbered page buffers are thereby simultaneously turned off.

At time t7, the sense and latch scheduler 162' generates an active high pulse signal SLO_BLSEN_dis, which causes output signals of the fourth S-R flip-flop FF4 and the seventh AND gate G7 in the bias control signal generator 164', to transition from high to low. As a result, the signal generator 164a outputs an odd-even bias control signal BLBIAS_OE having the ground voltage level. The fourth NMOS transistors M4_O corresponding to the odd-numbered page buffers, which are controlled by the odd-even bias control signal BLBIAS_OE, are thereby turned off.

Unlike the first embodiment, the precharge control signal nSOSHLD_O, at time t8, is maintained high. The sense and latch scheduler 162' generates an active high pulse signal SLO_SLSEL_en. This causes an output signal (or a latch select signal) SLDCH_O of the ninth S-R flip-flop FF9, in the latch select signal generator 170, to transition from low to high. As a result, latches of odd-numbered page buffers PB1, PB3, PB5, etc. are electrically connected to corresponding sense nodes SO1, SO3, SO5, etc., respectively.

At this time, the sense nodes may be fixed at the power supply voltage Vcc or the ground voltage GND according to latched values thereof (i.e., values latched in latches of the odd-numbered page buffers). For example, the first sense node SO1, corresponding to an ON cell, is fixed at the ground voltage, while the third sense node SO3, corresponding to an OFF cell, is held at the power supply voltage. A period from t3 to t8 is called "a first sense period."

During the first sense period, in which the odd-numbered page buffers PB1, PB3, PB5, etc. operate, the precharge control signal nSOSHLD_E is maintained low. The precharge transistors M6_E of the even-numbered page buffers PB2, PB4, PB6, etc. are turned on by the low-level precharge control signal nSOSHLD_E. The sense nodes SO2, SO4, SO6, etc. in the even-numbered page buffers are therefore maintained at a specific voltage (e.g., the power supply voltage) during the first sense period.

Unlike the prior art, when adjacent page buffers perform their sense operations, a floated sense node (corresponding to a bit line connected to an OFF cell) is not affected by voltage variation of a sense node corresponding to an ON cell. This is because sense nodes adjacent to the floated sense node are fixed at the specific voltage (e.g., the power supply voltage).

At time t9, the sense and latch scheduler 162' outputs an active high pulse signal SLE_SOSHIELD_dis and an output signal nSOSHLD_E of the fifth S-R flip-flop FF5, in the precharge control signal generator 166', transitions from low to high. This causes the precharge transistors M6_E of the even-numbered page buffers to be turned off.

At time t10, the sense and latch scheduler 162' generates an active high pulse signal SLE_BLSEN_en and an output signal of the third S-R flip-flop FF3, of the bias control signal generator 164', becomes high. This causes an even-even output signal BLSEN_EE of the fifth AND gate G5 to go high, turning on the second NMOS transistor M10 of the signal generator 164c. The even-even bias control signal BLBIAS_EE has the sense voltage Vsen, which is lower than the precharge voltage Vpre. A voltage on the second sense node SO2 is rapidly lowered. The second sense node SO2 corresponds to the fourth NMOS transistor M4_E of the second page buffer PB2. The transistor is connected to a bit line (e.g., BL4) of the ON cell and is controlled by the even-even bias control signal BLBIAS_EE.

On the other hand, a voltage (e.g., Vcc) is maintained on a sense node (e.g., SO4) corresponding to an OFF cell. In particular, the fourth sense node SO4 is connected to the fourth NMOS transistor M4_E of the fourth page buffer PB4. The transistor is in turn connected to a bit line (e.g., BL8) of the OFF cell and controlled by the bias control signal BLBIAS_EE.

The latch control signal generator 168', at time t11, causes the even latch control signal φLATCH_E to transition from low to high in response to the pulse signal SLE_LATCH_en from the sense and latch scheduler 162'. The seventh even NMOS transistors M8_E of the even-numbered page buffers are turned on by the high-level even latch control signal φLATCH_E. For example, since a voltage on a second sense node SO2, corresponding to an ON cell, is lower than the threshold voltage of the sixth even NMOS transistor M7_E, that transistor is turned off. As a result, an initial value "0" of a latch Q2, formed from two inverters INV1_E, INV2_E, is maintained.

A voltage on a fourth sense node SO4, corresponding to an OFF cell, is maintained at the power supply voltage. Because this voltage is higher than a trip voltage of the corresponding seventh even NMOS transistor M7_E, the transistor is turned on. As a result, an initial value of an inverter latch Q4 transitions from "0" to "1".

At time t12, the sense and latch scheduler 162' generates a pulse signal SLE_LATCH_dis that causes the even latch control signal φLATCH_E of the seventh S-R flip-flop FF7, in the latch control signal generator 168, to go low. The seventh NMOS transistors M8_E of the even-numbered page buffers are simultaneously turned off by the low level even latch control signal φLATCH_E.

At time t13, the sense and latch scheduler 162' generates a pulse signal SLE_BLSEN_dis, which causes output signals of the third S-R flip-flop FF3 and the fifth AND gate G5 to transition from high to low. As a result of the high to low transition of the signal BLSEN_EE, the signal generator 164c outputs an even-even bias control signal BLBIAS_EE having the ground voltage. The fourth even NMOS transistors M4_E are thereby turned off.

At time t14, the sense and latch scheduler 162' generates active high pulse signals SLE_SOSHIELD_en, SLO_SOSHIELD_en, SLO_SLSEL_dis. The output signal SLDCH_O of the latch select signal generator 170 transitions from high to low based on the active high pulse signal SLO_SLSEL_dis. The fifth NMOS transistors M5_O are turned off to isolate the odd sense nodes SO1, SO3, etc. from corresponding latches. At the same time, an output signal nSOSHLD_E of the fifth S-R flip-flop FF5 in the precharge control signal generator 166' becomes low based on the pulse signal SLE_SOSHIELD_en.

Similarly, an output signal nSOSHLD_O of the sixth S-R flip-flop FF6 in the precharge control signal generator 166' becomes low based on the pulse signal SLO_SOSHIELD_en. This causes all of the precharge transistors M6_E, M6_O in the page buffers PB1 to PBx to be turned on. All of the sense nodes SO1 to SOx are thereby charged up to the power supply voltage Vcc. A period from t9 to t14 is called "a second sense period."

During the second sense period, in which the even-numbered page buffers PB2, PB4, PB6, etc. operate, the latch select signal SLDCH_O is maintained high. The fifth NMOS transistors M5_O of the odd-numbered page buffers are turned on by the high-level latch select signal SLDCH_O. The sense nodes SO1, SO3, SO5, etc. in the odd-numbered page buffers are maintained at a specific voltage (e.g., the power supply voltage or the ground voltage) during the second sense period.

Unlike the prior art, when adjacent page buffers perform their sense operations, a floated sense node (i.e., a sense node corresponding to a bit line connected to an OFF cell) is not affected by voltage variation of a sense node corresponding to an ON cell. This is because sense nodes adjacent to the floated sense node are fixed at the specific voltage (e.g., the power supply voltage or the ground voltage).

For example, where a fourth sense node SO4, corresponding to an OFF cell, is floated, adjacent odd sense nodes SO3, SO5 are fixed at a specified voltage (e.g., the power supply voltage or the ground voltage). In this manner, the floated sense node SO4 is not affected by the voltage variation of a second sense node SO2 connected to an ON cell.

Finally, at time t15, as the sense and latch scheduler 162' generates an active high pulse signal READ_REC, a well-known recovery or discharge operation is carried out. During the recovery operation, voltages on the bit lines and the word lines are initialized.

As described above, sense nodes of even-numbered page buffers are fixed at a specific voltage during a first sense period in which odd-numbered page buffers operate. Sense nodes of odd-numbered page buffers are fixed at a specific voltage during a second sense period in which even-numbered page buffers operate. Using this control scheme, the voltage on a sense node corresponding to an OFF cell is not affected by voltage variations on a sense node corresponding to an ON cell.

Although the invention has been described in terms of exemplary aspects and embodiments, it should be understood that the scope of the invention is not limited to the disclosed aspects and embodiments. On the contrary, numerous modifications and arrangements that are within the spirit of the invention will be apparent to those of skill in the art. The claims, therefore, should be accorded their broadest interpretation so as to encompass all such modifications and arrangements.

What is claimed is:

1. A non-volatile memory device comprising:
   an array of memory cells arranged in rows and columns;
   a plurality of page buffers connected to the columns, wherein each of the page buffers comprises a bias transistor connected between a corresponding column and a corresponding sense node, a latch connected to the corresponding sense node, and a precharge transistor connected between a power supply voltage and the corresponding sense node; and
   a control logic configured to control the page buffers during a read operation, wherein the control logic is configured to control the bias and precharge transistors of respective page buffers to fix second sense nodes at a predetermined bias voltage during a first sensing period when voltages on first sense nodes are being sensed.

2. A non-volatile memory device according to claim 1, wherein the control logic is configured to control the bias and precharge transistors of the respective page buffers to fix the first sense nodes at the predetermined bias voltage during a second sensing period when voltages on the second sense nodes are being sensed.

3. A non-volatile memory device according to claim 1, wherein, during the first sensing period, the first sense nodes are configured to be connected to or floated from corresponding columns based on a state of respective memory cells of the corresponding columns, and wherein the second sense nodes are configured to be fixed at the predetermined bias voltage.

4. A non-volatile memory device according to claim 3, wherein, during the second sensing period, the second sense nodes are configured to be connected to or floated from corresponding columns based on a state of respective memory cells of the corresponding columns, and wherein the first sense nodes are configured to be fixed at the predetermined bias voltage.

5. A non-volatile memory device according to claim 4, wherein each of the columns comprises two bit lines.

6. A non-volatile memory device according to claim 5, wherein a first one of the bit lines of each column is configured to be selected during the first or second sensing period, and wherein a second one of the bit lines is configured not to be selected during the first and second sensing periods.

7. A non-volatile memory device according to claim 3, wherein even-numbered ones of the first bit lines of the columns are configured to be selected during the first sensing period and wherein odd-numbered ones of the first bit lines are configured to be selected during the second sensing period.

8. A non-volatile memory device according to claim 7, wherein the predetermined voltage is either a power supply voltage or a ground voltage.

9. A flash electrically erasable and programmable read-only memory (EEPROM) device comprising:

a memory cell array comprising a plurality of cell strings, wherein each of the cell strings comprises a plurality of memory cells arranged in series between a first string select transistor and a second string select transistor;

a plurality of bit lines connected to the strings, wherein the bit lines are divided into a plurality of bit line groups, each group comprising two bit lines;

a plurality of page buffers, wherein each page buffer corresponds to one of the bit line groups, and wherein each of the page buffers comprises a bit line select section configured to select one of the bit lines of each bit line group, a precharge section configured to supply a variable current to a sense node connected to a corresponding bit line group through a bit line bias section, a latch section configured to latch data determined according to a voltage of the sense node, and a switch section connected between the sense node and the latch section; and a page buffer control logic configured to control the precharge section of each page buffer such that during a first sensing period, when data is read out from memory cells in a selected page through first ones of the bit lines of first bit line groups, sense nodes corresponding to second bit line groups are fixed at a predetermined bias voltage.

10. A flash EEPROM device according to claim 9, wherein the page buffer control logic is further configured to control the precharge section of each page buffer such that sense nodes corresponding to first bit line groups are fixed at the predetermined bias voltage during a second sensing period when data is read out from memory cells in the selected page through first ones of bit lines of the second bit line groups.

11. A flash EEPROM device according to claim 10, wherein the bias voltage is either a power supply voltage or a ground voltage.

12. A non-volatile semiconductor memory device comprising:

an array of memory cells arranged in a plurality of rows and columns;

a plurality of page buffers each connected to the columns, wherein each of the page buffers comprises a bias transistor connected between a corresponding column and a corresponding sense node, a latch connected to the corresponding sense node, a precharge transistor connected between a power supply voltage and the corresponding sense node, and a switch transistor connected between the latch and the corresponding sense node; and a control logic configured to control the page buffers during a read operation, wherein the control logic is configured to control the bias transistor, the precharge transistor, and the switch transistor of the page buffers such that second sense nodes are fixed at a predetermined bias voltage during a first sense period when voltages on first sense nodes are sensed.

13. A flash EEPROM device according to claim 12, wherein the control logic is further configured to control the bias, precharge, and switch transistors of each of the page buffers such that first sense nodes are fixed at the bias voltage during a second sense period when voltages on second sense nodes are sensed.

14. A non-volatile memory device according to claim 12, wherein during the first sensing period, the first sense nodes are configured to be connected to or floated from corresponding columns based on a state of respective memory cells, and wherein the second sense nodes are configured to be fixed at the predetermined voltage.

15. A non-volatile memory device according to claim 13, wherein, during the second sensing period, each of the second sense nodes is configured to be connected to or floated from a corresponding column based on a state of a respective memory cell, and wherein the first sense nodes are configured to be fixed at the predetermined voltage.

16. A flash EEPROM device according to claim 15, wherein the bias voltage is either a power supply voltage or a ground voltage.

17. A non-volatile memory device comprising:

a memory cell array having a plurality of strings, each string comprising a plurality of memory cells connected in series between a first select transistor and a second select transistor;

a plurality of bit lines each connected to the strings, wherein the bit lines are divided into a plurality of bit line groups, each bit line group comprising a plurality of bit lines;

a plurality of page buffers corresponding to the bit line groups, wherein each of the page buffers comprises a bit line select section for selecting a bit line of each bit line group, a precharge section for supplying a variable current to a sense node connected to a corresponding bit line group through a bit line bias section, a latch section for latching data determined according to a voltage of the sense node, and a switch section connected between the sense node and the latch section; and a page buffer control logic configured to control the precharge and switch sections of each page buffer such that during a first sensing period, when data is read out from memory cells in a selected page through first ones of bit lines of first bit line groups, sense nodes corresponding to second bit line groups are fixed at a predetermined bias voltage.

18. A flash EEPROM device according to claim 17, wherein the page buffer control logic is configured to control the precharge and switch sections of each page buffer such that sense nodes corresponding to first bit line groups are fixed at the predetermined bias voltage during a second sensing period when data is read out from memory cells in the selected page through first ones of bit lines of the second bit line groups.

* * * * *

UNITED STATES PATENT AND TRADEMARK OFFICE
CERTIFICATE OF CORRECTION

PATENT NO.    : 6,813,214 B2
DATED         : November 2, 2004
INVENTOR(S)   : Cho et al.

It is certified that error appears in the above-identified patent and that said Letters Patent is hereby corrected as shown below:

Column 7,
Line 30, replace "transistors M1_O, M2_, M3_O" with -- transistors M1_O, M2_O, M3_O --.
Line 31, replace "transistor M6_," with -- transistor M6_O --.
Line 34, replace "transistors M1_, M2_O" with -- transistors M1_O, M2_O --.

Column 13,
Line 43, replace "transistors MS_E" with -- transistors M8_E --.

Signed and Sealed this

Twenty-seventh Day of December, 2005

JON W. DUDAS
*Director of the United States Patent and Trademark Office*